United States Patent
Mallikarjunaswamy

(10) Patent No.: US 10,497,697 B2
(45) Date of Patent: Dec. 3, 2019

(54) LOW CAPACITANCE TRANSIENT VOLTAGE SUPPRESSOR

(71) Applicant: Alpha and Omega Semiconductor (Cayman) Ltd., Grand Cayman (KY)

(72) Inventor: Shekar Mallikarjunaswamy, San Jose, CA (US)

(73) Assignee: Alpha and Omega Semiconductor (Cayman) Ltd., Grand Cayman (KY)

(*) Notice: Subject to any disclaimer, the term of this patent is extended or adjusted under 35 U.S.C. 154(b) by 0 days.

(21) Appl. No.: 16/162,132

(22) Filed: Oct. 16, 2018

(65) Prior Publication Data
US 2019/0123039 A1  Apr. 25, 2019

Related U.S. Application Data

(63) Continuation of application No. 15/788,246, filed on Oct. 19, 2017, now Pat. No. 10,141,300.

(51) Int. Cl.
| | |
|---|---|
| H01L 27/02 | (2006.01) |
| H01L 29/06 | (2006.01) |
| H01L 29/74 | (2006.01) |
| H01L 29/861 | (2006.01) |
| H01L 29/49 | (2006.01) |
| H01L 29/40 | (2006.01) |
| H01L 29/87 | (2006.01) |

(52) U.S. Cl.
CPC ...... *H01L 27/0262* (2013.01); *H01L 29/0649* (2013.01); *H01L 29/0692* (2013.01); *H01L 29/742* (2013.01); *H01L 29/7412* (2013.01); *H01L 29/861* (2013.01); *H01L 29/402* (2013.01); *H01L 29/4916* (2013.01); *H01L 29/8611* (2013.01); *H01L 29/87* (2013.01)

(58) Field of Classification Search
CPC ............... H01L 27/0262; H01L 27/098; H01L 27/0255; H01L 27/0296; H01L 29/66136; H01L 23/60
See application file for complete search history.

(56) References Cited

U.S. PATENT DOCUMENTS

| | | |
|---|---|---|
| 7,538,997 B2 | 5/2009 | Mallikararjunaswamy |
| 7,554,839 B2 | 6/2009 | Bobde |
| 7,781,826 B2 | 8/2010 | Mallikararjunaswamy et al. |
| 7,795,987 B2 | 9/2010 | Bobde |
| 7,863,995 B2 | 1/2011 | Ho et al. |
| 7,880,223 B2 | 2/2011 | Bobde |

(Continued)

FOREIGN PATENT DOCUMENTS

| | | |
|---|---|---|
| CN | 102017144 | 11/2012 |
| CN | 106028568 | 10/2016 |

(Continued)

*Primary Examiner* — Jae Lee
(74) *Attorney, Agent, or Firm* — Patent Law Works LLP

(57) ABSTRACT

A transient voltage suppressor (TVS) circuit includes a first finger and a second finger of semiconductor regions arranged laterally along a first direction on a major surface of a semiconductor layer, the first finger and second finger extending in a second direction orthogonal to the first direction on the major surface of the semiconductor layer. The semiconductor regions in a first portion of the first and second fingers form a silicon controlled rectifier and the semiconductor regions in a second portion of the first and second fingers form a P-N junction diode.

21 Claims, 18 Drawing Sheets

(56) References Cited

U.S. PATENT DOCUMENTS

| | | | |
|---|---|---|---|
| 8,218,276 B2 | 7/2012 | Mallikarjunaswamy | |
| 8,338,854 B2 | 12/2012 | Bobde et al. | |
| 8,338,915 B2 | 12/2012 | Mallikararjunaswamy et al. | |
| 8,698,196 B2 | 4/2014 | Guan et al. | |
| 9,230,953 B2 | 1/2016 | Pan et al. | |
| 9,385,115 B2 | 7/2016 | Notermans et al. | |
| 9,627,372 B2 | 4/2017 | Lai | |
| 2007/0008667 A1* | 1/2007 | Steinhoff | H01L 27/0262 361/56 |
| 2009/0040670 A1* | 2/2009 | Van Camp | H01L 27/0255 361/56 |
| 2009/0045436 A1* | 2/2009 | Verleye | H01L 27/0262 257/173 |
| 2009/0237847 A1 | 9/2009 | Ryu et al. | |
| 2009/0268361 A1 | 10/2009 | Mallikarjunaswamy | |
| 2013/0229223 A1 | 9/2013 | Shrivastava et al. | |
| 2015/0002967 A1 | 1/2015 | Kawase et al. | |
| 2015/0207312 A1 | 7/2015 | Wang et al. | |
| 2015/0221630 A1* | 8/2015 | Morrish | H01L 27/0248 257/499 |
| 2016/0104700 A1 | 4/2016 | Notermans et al. | |
| 2017/0012036 A1 | 1/2017 | Quax et al. | |
| 2017/0092760 A1 | 3/2017 | Parris et al. | |
| 2017/0117267 A1 | 4/2017 | De Raad et al. | |

FOREIGN PATENT DOCUMENTS

| | | |
|---|---|---|
| CN | 206490429 | 9/2017 |
| JP | 2017045949 A | 3/2017 |
| TW | I407658 B | 9/2013 |
| TW | I477018 B | 3/2015 |

* cited by examiner

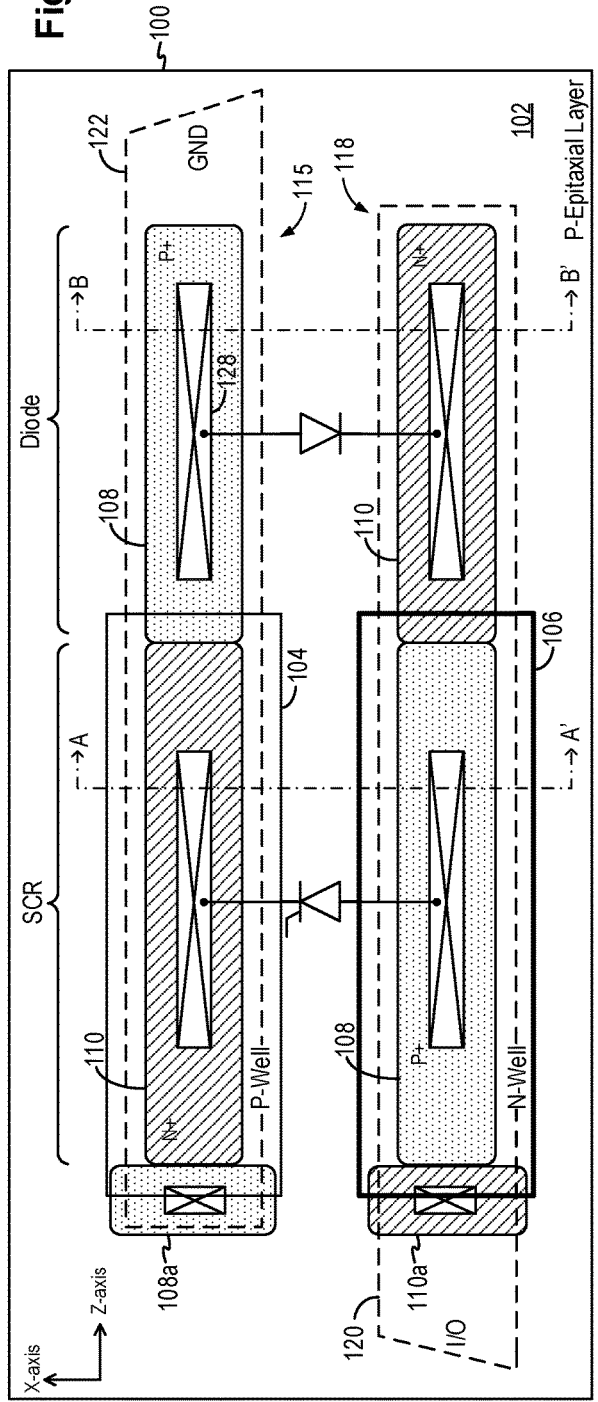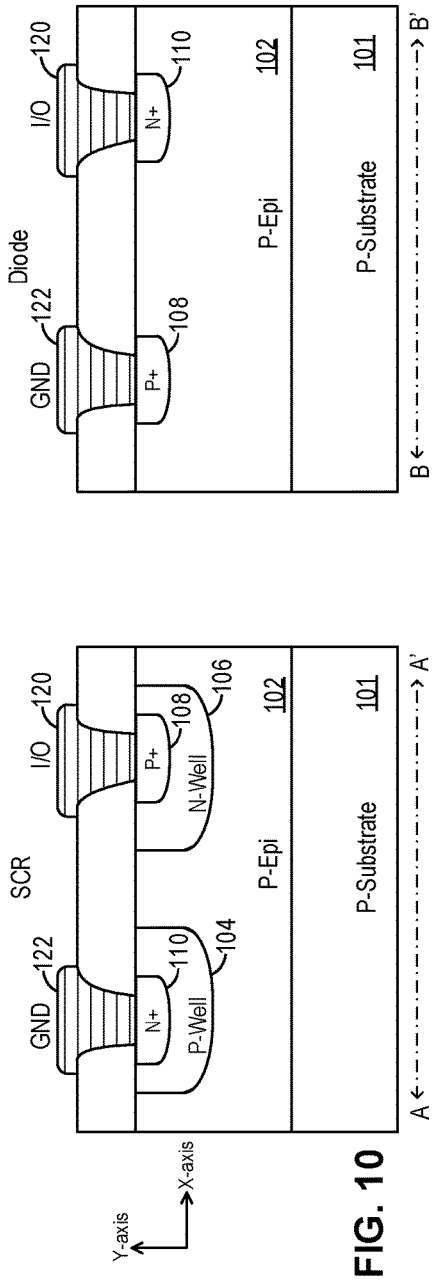

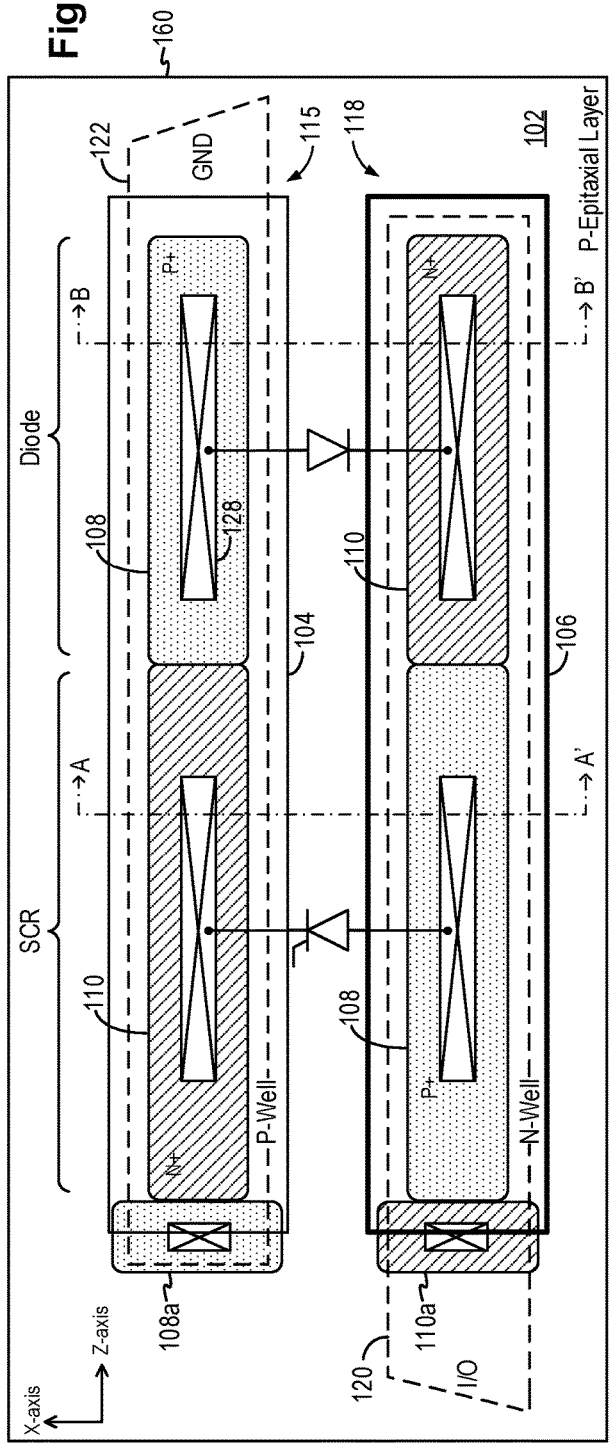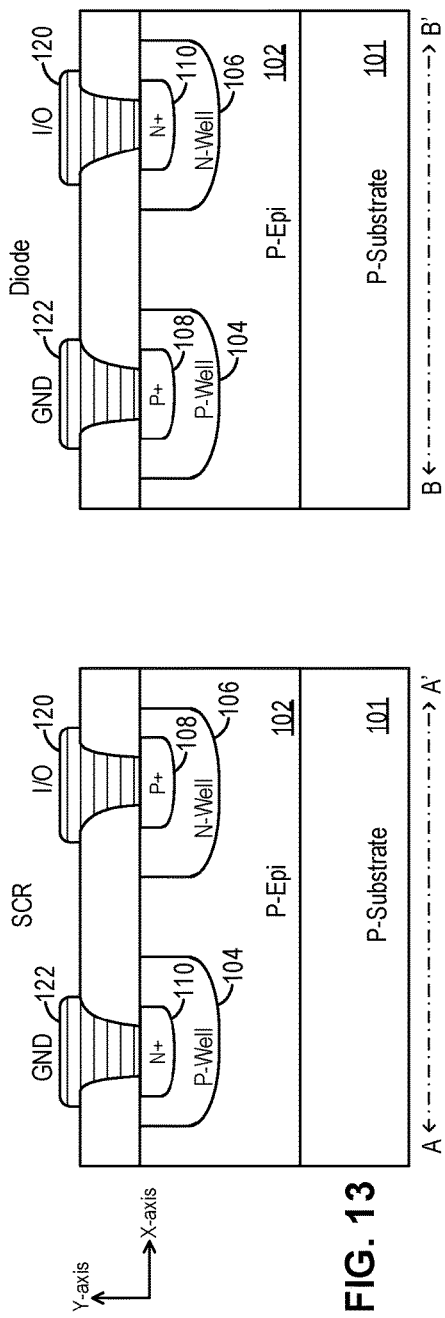

LOW CAPACITANCE TRANSIENT VOLTAGE SUPPRESSOR

CROSS REFERENCE TO OTHER APPLICATIONS

This application is a continuation of U.S. patent application Ser. No. 15/788,246, entitled LOW CAPACITANCE TRANSIENT VOLTAGE SUPPRESSOR, filed Oct. 19, 2017, now U.S. Pat. No. 10,141,300, issued Nov. 27, 2018, which is incorporated herein by reference for all purposes.

BACKGROUND OF THE INVENTION

Voltages and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are discrete devices commonly employed for protecting integrated circuits from damages due to the occurrences of transients or over-voltage conditions at the integrated circuit. Over-voltage protection are important for consumer devices or the Internet of Things devices as these electronic devices are exposed to frequent human handling and, as a result, may be susceptible to ESD or transient voltage events that may damage the devices.

In particular, the power supply pins and the data pins of the electronic devices both require protection from over-voltages conditions due to ESD events or switching and lightning transient events. Typically, the power supply pins need high surge protection but can tolerate protection devices with higher capacitance. Meanwhile, the data pins, which may operate at high data speed, requires protection devices that provide surge protection with low capacitance so as not to interfere with the data speed of the protected data pins.

Existing TVS protection solutions applied to input/output (I/O) terminals exist both in vertical and lateral type of semiconductor circuit structures. In conventional vertical TVS structures, the I/O current during ESD flows from high side and low side steering diode vertically to ground. In conventional lateral TVS structures, both the high side and the low side steering diode are integrated laterally on the semiconductor substrate. Regardless of the TVS circuit structure, a TVS protection device applied to high speed I/O applications should have low capacitance so as not to impede the signal activity on the high speed data lines.

BRIEF DESCRIPTION OF THE DRAWINGS

Various embodiments of the invention are disclosed in the following detailed description and the accompanying drawings.

FIG. 3 illustrates a bank of TVS devices configured in a parallel fashion to form a multi-channel protection circuit 20 for providing transient voltage protection to a bank of I/O terminals I/O1 to I/ON.

FIG. 9 is a detailed top view of a pair of fingers in the TVS protection device of FIG. 7 in some embodiments.

FIG. 10 is a cross-sectional view of a part of the TVS device of FIG. 9 along the A-A' axis in some embodiments.

FIG. 11 is a cross-sectional view of a part of the TVS device of FIG. 9 along the B-B' axis in some embodiments.

FIG. 12 is a detailed top view of a pair of fingers in a TVS protection device in an alternate embodiment.

FIG. 13 is a cross-sectional view of a part of the TVS device of FIG. 12 along the A-A' axis in some embodiments.

FIG. 14 is a cross-sectional view of a part of the TVS device of FIG. 12 along the B-B' axis in some embodiments.

FIG. 22(a), is a top view of a TVS device incorporating a MOS trigger voltage adjust structure in some embodiments of the present invention.

DETAILED DESCRIPTION

Figure 1:
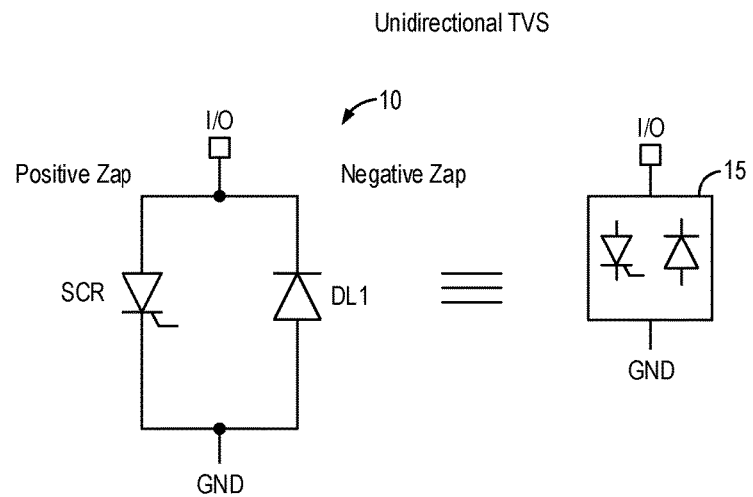
FIG. 1 is a circuit diagram of a unidirectional TVS protection device in embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a transient voltage suppressor (TVS) device includes a P-N junction diode and a silicon controlled rectifier (SCR) formed integrated in a lateral device structure of a semiconductor layer. The lateral device structure includes multiple fingers of semiconductor regions arranged laterally along a first direction on a major surface of the semiconductor layer, defining current conducting regions between the fingers. The current paths for the SCR and the P-N junction diode are formed in each current conducting region but the current path for the SCR is predominantly separated from the current path for the P-N junction diode in each current conducting region in a second direction orthogonal to the first direction on the major surface of the semiconductor layer. The TVS device of the present invention, formed using an integrated SCR and P-N diode device structure, realizes low capacitance at the protected node by reducing the capacitance presented by the P-N junction diode. In this manner, the TVS device with low parasitic capacitance, can be effectively apply to protect data pins of an integrated circuit, especially when the data pins are used in high speed applications.

In the present description, a transient voltage suppressor (TVS) device refers to a protection device or protection circuit coupled to protect an integrated circuit node ("the protected node") from over-voltage transient conditions, such as voltage surges or voltage spikes. The TVS device operates by shunting the excess current from the protected node when a surge voltage, exceeding the breakdown voltage of the TVS device, is applied to the protected node. The TVS device typically includes a clamp device for clamping the voltage at the protected node at a clamping voltage much lower than the voltage value of the voltage surge while safely conducting away the surge current.

A TVS device can be either a unidirectional device or a bidirectional device. A unidirectional TVS device has an asymmetrical current-voltage characteristic and is typically used for protecting circuit nodes whose signals are unidirectional—that is, the signals are always above or below a certain reference voltage, such as ground. For example, a unidirectional TVS device may be used to protect a circuit node whose normal signal is a positive voltage from 0V to 5V. On the other hand, a bidirectional TVS device has a symmetrical current-voltage characteristic and is typically used for protecting circuit nodes whose signals are bidirectional or can have voltage levels both above and below the reference voltage, such as ground. For example, a bidirectional TVS device may be used to protect a circuit node whose normal signal varies symmetrically above and below ground, such as from −12V to 12V. In this case, the bidirectional TVS protects the circuit node from a surge voltage that goes below −12 V or above 12V.

In operation, the TVS device is in a blocking mode and is non-conductive except for possible leakage current when the voltage at the protected node is below the breakdown voltage of the TVS device, sometimes referred to as a reverse standoff voltage. That is, when the voltage at the protected node is within the operating voltage range for the protected node, the TVS device is non-conductive and is in the blocking mode. However, during the blocking mode, the TVS device presents a capacitance to the protected node. When the protected node is associated with a high speed data pin, the capacitance of the TVS device in the blocking mode or non-conductive mode should be low so as not to impede the high speed operation of the data pin.

In some embodiments, the TVS device of the present invention realizes a low capacitance value of less than 0.2 pf in the blocking mode. The low capacitance TVS device of the present invention can be advantageously applied to protect high-speed data pins or input-output (I/O) terminals in high speed electronic applications, such as data pins in USB3.1 data bus, HDMI-2.0 data bus, or V by One cables.

The TVS device of the present invention realizes many advantages over conventional TVS protection devices. For example, the TVS device of the present invention uses an integrated diode/SCR structure to realize low junction capacitance at the protected node. Accordingly, the TVS device of the present invention is suitable for use in high speed data pin applications. Furthermore, the trigger voltage of the TVS device can be tailored to a desired value by adjusting the breakdown voltage of the SCR device without changing the device area. In some examples, the TVS device incorporates an NPN transistor or an MOS device to enable adjustment of the trigger voltage to a desired value.

FIG. 1 is a circuit diagram of a unidirectional TVS protection device in embodiments of the present invention. Referring to FIG. 1, the TVS protection device 10 (or "TVS device 10") includes a P-N junction diode DL1 and a silicon controlled rectifier (SCR) configured in parallel between the I/O terminal to be protected ("the protected node") and the ground potential. The TVS device 10 merges the high-side steering diode and the clamping device into a single SCR device. Furthermore, the TVS device 10 integrates the low-side steering diode DL1 with the SCR in a lateral device structure formed in a semiconductor layer. The TVS device 10 is constructed to present a low parasitic capacitance to the protected node, making the TVS device 10 advantageous in high speed data lines applications. In the present embodiment, the circuit symbol 15 is used to represent the TVS protection device 10 including the parallely connected P-N junction diode and the SCR.

Figure 2:
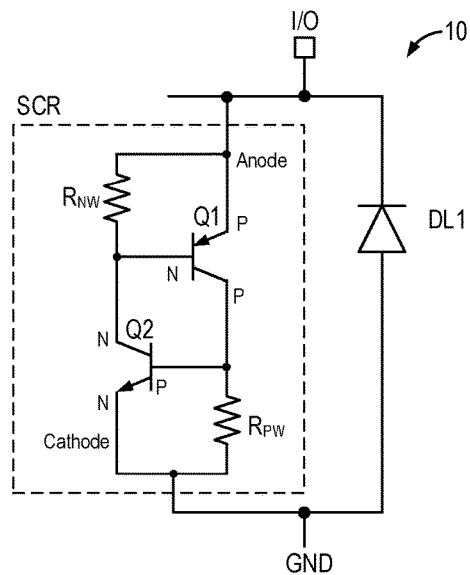
FIG. 2 is an equivalent circuit diagram of the TVS protection device in FIG. 1.

FIG. 2 is an equivalent circuit diagram of the TVS protection device in FIG. 1. Referring to FIG. 2, the TVS device 10 includes a P-N junction diode DL1 connected in a forward direction between the protected node (I/O terminal) and the ground potential. That is, the anode of the diode DL1 is connected to the ground node and the cathode of the diode DL1 is connected to the protected node. Diode DL1 functions as the low-side steering diode of the TVS protection device. The TVS device 10 includes the SCR device connected in parallel with the P-N junction diode DL1. In particular, the SCR device can be represented as two back-to-back connected PNP and NPN bipolar transistors. The anode of the SCR device is the P-type emitter of the PNP bipolar transistor which is also connected to the N-type base through the base resistance $R_{NW}$. The cathode of the SCR device is the N-type emitter of the NPN bipolar transistor which is connected to ground potential and to the N-type base of the NPN bipolar transistor through the base resistance $R_{PW}$. As thus configured, contributions to the parasitic capacitance of the TVS device at the protected node (I/O terminal) are mainly from the N-type region of the P-N junction diode DL1 and the anode of the SCR device.

Figure 3:
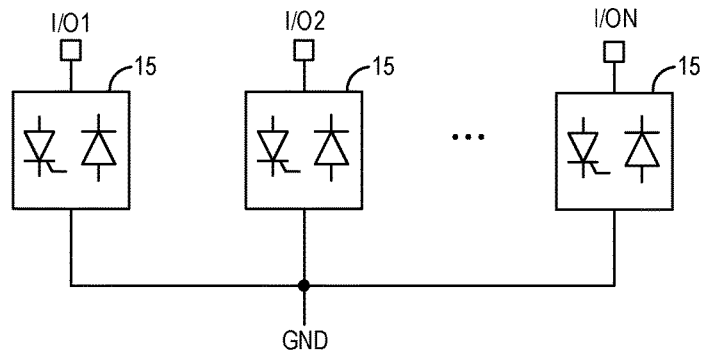

The unidirectional TVS device 10 in FIG. 1 can be used to form a multi-channel TVS protection circuit for multiple protected nodes. FIG. 3 illustrates a bank of TVS devices 10, illustrated by symbol 15, configured in a parallel fashion to form a multi-channel protection circuit 20 for providing transient voltage protection to a bank of I/O terminals I/O1 to I/ON. In some examples, the multi-channel protection circuit 20 may include four to five TVS protection devices 10 for protecting four to five protected nodes.

In FIGS. 1 and 3, the TVS protection device 10 is connected between the protected node (I/O terminal) and the ground potential for providing protection of a positive or negative voltage zap to ground. In other embodiments, the TVS protection device 10 can also be connected between the protected node (I/O terminal) and the power supply potential (such as Vcc or Vdd) for providing protection of a positive or negative voltage zap to the power supply potential. In other embodiments, the TVS protection device 10 can also be connected between any two circuit nodes for providing transient voltage protection between the two nodes.

Figure 4:
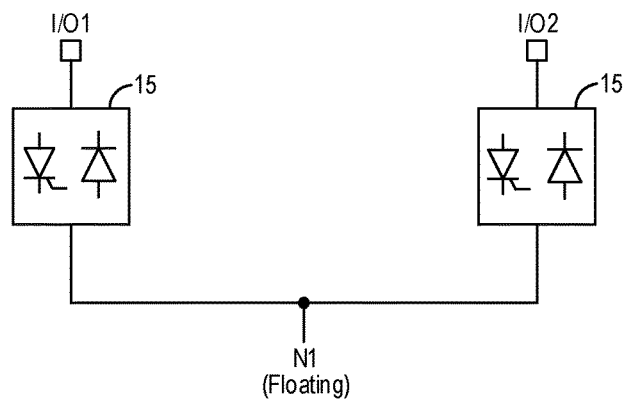
FIG. 4 illustrates a bidirectional multi-channel TVS protection device constructed using the TVS device of FIG. 1 in some embodiments of the present invention.

Furthermore, the TVS protection devices in FIGS. 1 and 3 are configured as unidirectional TVS devices with asymmetrical current-voltage characteristics. In other embodiments, the TVS protection device 10 can be configured as a bidirectional TVS protection device having symmetrical current-voltage characteristics. FIG. 4 illustrates a bidirectional multi-channel TVS protection device 30 constructed using the TVS device 10 of FIG. 1 in some embodiments of the present invention. Referring to FIG. 4, the bidirectional multi-channel TVS protection device 30 includes a TVS protection device 10 coupled to a first I/O terminal I/O1 and another TVS protection device 10 coupled to a second I/O terminal I/O2. The common node N1 between the two TVS protection devices is left floating, or not electrically connected to or biased to any electrical potential. Zap current from positive or negative zaps to one I/O terminal flows through the TVS protection device to the other I/O terminal.

Figure 5:
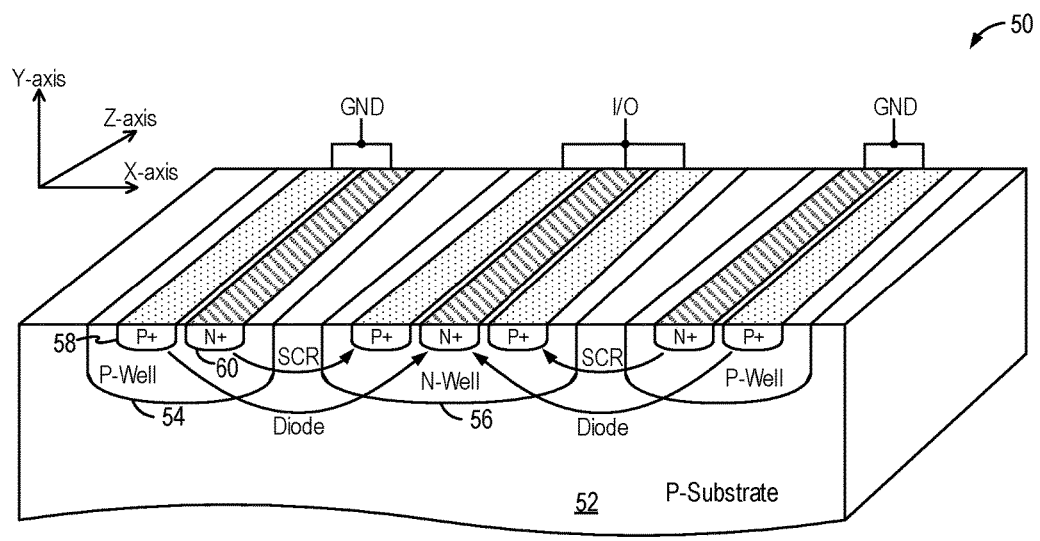
FIG. 5 is a perspective view of an exemplary device structure of the TVS protection device in some examples.

FIG. 5 is a perspective view of an exemplary device structure of the TVS protection device in some examples. Referring to FIG. 5, the TVS protection device 50 uses a lateral device structure in a semiconductor substrate 52 to construct the TVS protection device of FIG. 1. In the exemplary device structure shown in FIG. 5, the TVS device 50 includes alternating P-Wells regions 54 and N-Well regions 56 arranged laterally in a first direction at a major surface of the P-type semiconductor substrate 52. In the present description, the first direction on the surface of the semiconductor substrate 52 is taken to be on the X-axis. Each P-Well region 54 houses a P+ doped region 58 and an N+ doped region 60. Each N-Well region 56 houses an N+ doped region 60 formed between two P+ doped regions 58. The well regions and the doped regions are formed as elongated fingers extended into the P-type substrate 52 in the Z-axis. The doped regions in the N-Well 56 are connected to the protected node (I/O terminal) while the doped regions in the P-Well 54 are connected to the ground potential. As thus constructed, the TVS device 50 includes current paths formed between an adjacent pair of P-Well region and N-Well region. The well regions and the doped regions are arranged in an interleaved manner to form the P-N junction diode and the SCR device of the TVS protection device. In particular, the P-N junction diode and the SCR device share each of the current path along the entire length of the well regions and doped regions. The TVS protection circuit 50 is not desirable for use with high-speed I/0 terminals as the TVS device presents significant parasitic capacitance to the protected node. Furthermore, the P-N junction diode thus formed has higher resistance since it is located in the center of the N-Well and P-well. The TVS protection device 50 occupies more area for low clamping ability.

Figure 6:
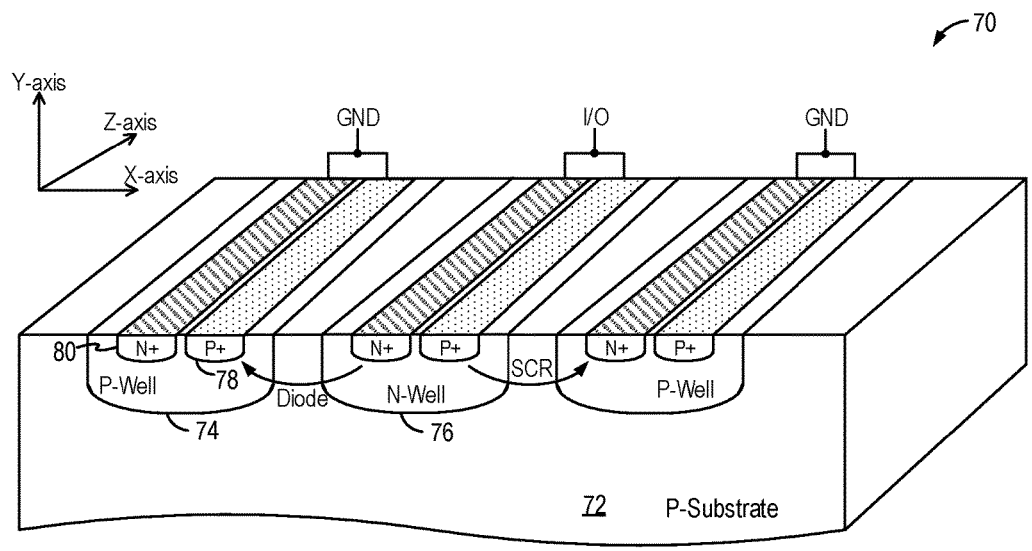
FIG. 6 is a perspective view of an exemplary device structure of the TVS protection device in another example.

FIG. 6 is a perspective view of an exemplary device structure of the TVS protection device in another example. Referring to FIG. 6, the TVS protection device 70 uses a lateral device structure in a semiconductor substrate 72 similar to the TVS device 50 of FIG. 5. However, in the TVS device 70 of FIG. 6, each well region (P-Well 74 and N-Well 76) includes a P+ doped region 78 and an N+ doped region 80 arranged to form current paths for the P-N junction diode and the SCR device in alternate current paths. That is, the P-N junction diode and the SCR device do not share the same current path. The P-N junction diode conducts in a current path between two adjacent P and N well regions while the SCR device conducts in the next current path between the next pair of adjacent P and N well regions. In each current path, the P-N junction diode or the SCR device conducts current along the entire length of the well regions and doped regions in the Z-axis. The TVS protection device 70, while presenting a lower capacitance to the protected node, has various drawbacks. For instance, the device parameters, such as holding voltage and trigger voltage, of the TVS protection device 70 cannot be tailored easily and tailoring of the device parameters may result in undesirable increased device area and therefore increased capacitance. Also, triggering of the TVS protection device 70 is not uniform.

Figures 7, 7A:
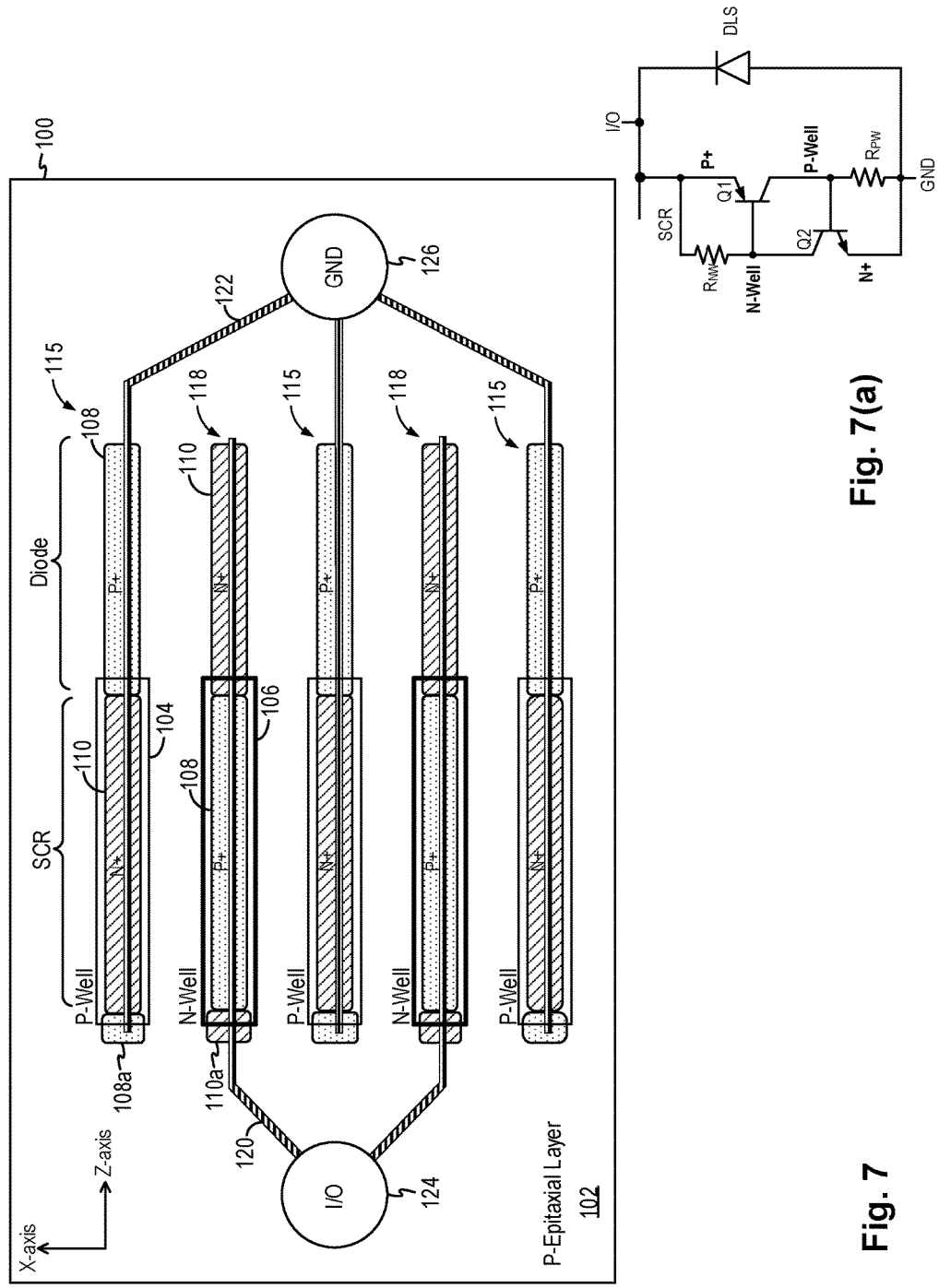
FIG. 7, which includes
FIG. 7(a), is a top view of a low capacitance TVS protection device in embodiments of the present invention.

FIG. 7, which includes FIG. 7(a), is a top view of a low capacitance TVS protection device in embodiments of the present invention. In the present illustration, the top view refers to the Z-axis plane of the TVS protection device. Referring to FIG. 7, a TVS protection device 100 of the present invention is formed in a semiconductor layer. In the present embodiment, the semiconductor layer includes an epitaxial layer 102 formed on a semiconductor substrate. In one example, the epitaxial layer 102 is a P-type epitaxial layer and the substrate is a P-type substrate. Furthermore, in some embodiments, the P-type substrate is a lightly doped substrate and the P-type epitaxial layer 102 may be a lightly doped P-type epitaxial layer or intrinsic epitaxial layer. For example, the P-type substrate may have a resistance of 20 ohm-cm and the P-type epitaxial layer may have a resistance of about 100 ohms-cm or higher. The P-type epitaxial layer 102 may have a thickness of about 20 µm.

The TVS protection device ("TVS device") 100 includes multiple fingers of semiconductor regions arranged laterally along a first direction on a major surface of the semiconductor layer. In the present description, the first direction on the major surface is taken to be the X-axis, as shown in FIG. 7. Each finger is formed by a first doped region and a second doped region of opposite conductivity types arranged lengthwise in a second direction along an axis orthogonal to the first direction on the major surface of the semiconductor layer. In the present description, the orthogonal axis is taken to be the Z-axis, as shown in FIG. 7. In the present embodiment, the first doped region is housed in a well region of the opposite conductivity type to the first doped region. Furthermore, in the present embodiment, the second doped region is formed in the epitaxial layer and overlaps a small portion of the well region at one end. The multiple fingers are arranged so that adjacent fingers are formed by doped regions of opposite conductivity types. That is, a first finger may be formed with a first doped region of the first conductivity type housed in a well region of the second conductivity type, opposite the first conductivity type. The first finger also has a second doped region of the second conductivity type overlapping the well region. Then, a second finger, adjacent to the first finger, will be formed with a first doped region of the second conductivity type housed in a well region of the first conductivity type and a second doped region of the first conductivity type.

In the present description, the multiple fingers forming the TVS device 100 will be referenced by the conductivity type of the well region of the finger housing the first doped region. Accordingly, a finger 115 is referred to as a P-Well finger while a finger 118 is referred to as an N-Well finger. In the P-Well finger 115, the first doped region is an N+ doped region 110 housed in the P-Well 104 and the second doped region is a P+ doped region 108 arranged lengthwise along the finger in the Z-axis. The P+ doped region 108 is formed in the P-type epitaxial layer 102 but overlaps the P-Well 104 by a small portion. In the N-Well finger 118, the first doped region is a P+ doped region 108 housed in the N-Well 106 and the second doped region is an N+ doped region 110 arranged lengthwise along the finger in the Z-axis. The N+ doped region 110 is formed in the P-type epitaxial layer 102 but overlaps the N-Well 106 by a small portion.

The TVS device 100 is formed by alternating P-Well fingers 115 and N-Well fingers 118, as shown in FIG. 7. The P-Well fingers 115 are electrically connected to the ground terminal 126 by conductive lines 122, such as metal lines. The N-Well fingers 118 are electrically connected to the protected node 124 by conductive lines 120, such as metal lines. In the present example, the protected node 124 is an I/O terminal of an integrated circuit. The conductive lines 120 and 122 connect to the doped regions through contacts that not shown in FIG. 7. Furthermore, the depiction of conductive lines 120 and 122 in FIG. 7 is representative only in order to illustrate the semiconductor regions more clearly. One of ordinary skill in the art would appreciate that in actual physical layout of the TVS device 100, the conductive lines or metal lines 120, 122 will most likely formed over a large portion of the semiconductor regions underneath. FIG. 7 is illustrative only and is not intended to be limiting.

The TVS device 100, the P-wells 104 in the P-Well fingers, which form the base region of the NPN transistor of the SCR, are electrically connected to the ground potential through the overlapped P+ doped region 108. In the present embodiment, to enhance the well electrical connection and to encourage symmetrical current flow during a transient event, each of the P-Wells 104 includes an additional P+ doped region 108a formed at the opposite end of the P-Well from the overlapped P+ doped region. The P+ doped region 108a is also electrically connected to the ground node (126). Similarly for the N-Wells, each of the N-Wells 106 includes an additional N+ doped region 110a formed at the opposite end of the N-Well from the overlapped N+ doped region. The N+ doped region 110a is electrically connected to the protected node 124 (I/O terminal). In this manner, each of the P-Wells 104 is electrically connected to the ground node 126 through the P+ region 108 at one end and also through the P+ doped region 108a at the opposite end. Meanwhile, each of the N-Wells 104 is electrically connected to the protected node 124 through the N+ region 110 at one end and also through the N+ doped region 110a at the opposite end.

TVS device 100 is formed by alternating P-Well fingers 115 and N-Well fingers 118 which form the SCR device as the high-side protection structure and the P-N junction diode as the low-side protection structure. The N-Well fingers 118 are electrically connected to the protected node, such as an I/O terminal 124. The P-Well fingers 115 are electrically connected to the ground node 126. In this manner, a unidirectional single-channel TVS device 100 is constructed with the SCR device formed by the first doped regions and the well regions in the alternating N-Well and P-Well fingers and the P-N junction diode formed by the second doped regions in the alternating N-Well and P-Well fingers. In particular, the SCR device is formed by the P+ doped region 108 and the N-Well 106, the P-Well 104 and the N+ doped region 110 between a pair of adjacent N-Well and P-Well fingers 118, 115. The P-N junction diode is formed by the N+ doped region 110 and the P+ doped region 108 between a pair of adjacent N-Well and P-Well fingers 118, 115. FIG. 7(a) illustrates the equivalent circuit of the TVS device 100 of FIG. 7. The SCR device is formed by the P+ region, the N-Well, the P-Well and the N+ region between adjacent pair of N-Well and P-Well fingers.

A salient feature of the TVS device 100 is that the current paths for the SCR device and the P-N junction diode are formed between each pair of fingers but are separated in the orthogonal direction. More specifically, the alternating P-Well fingers and N-Well fingers define current conducting regions between the fingers. The current paths for the SCR device and the P-N junction diode are formed in each current conducting region between a pair of fingers but the current path for the SCR device is separated from the current path for the P-N junction diode in each current conducting region in the direction orthogonal to the first direction on the major surface of the semiconductor substrate. That is, the SCR current path is separated from the P-N junction diode current path in the Z-axis, orthogonal to the X-axis being the first direction on the major surface of the semiconductor substrate.

As thus constructed, the TVS device 100 presents a low capacitance to the protected node 124 (the I/O terminal). In particular, the P-N junction diode is the main contributor of parasitic capacitance to the protected node. In embodiments of the present invention, the P-N junction diode is formed by doped regions that are formed in the epitaxial layer 102 without any well regions Eliminating the well regions for the doped regions of the P-N junction diode has the effect of reducing the parasitic capacitance as seen by the protected node. In this manner, the TVS device 100 realizes low capacitance at the protected node.

Figure 8:
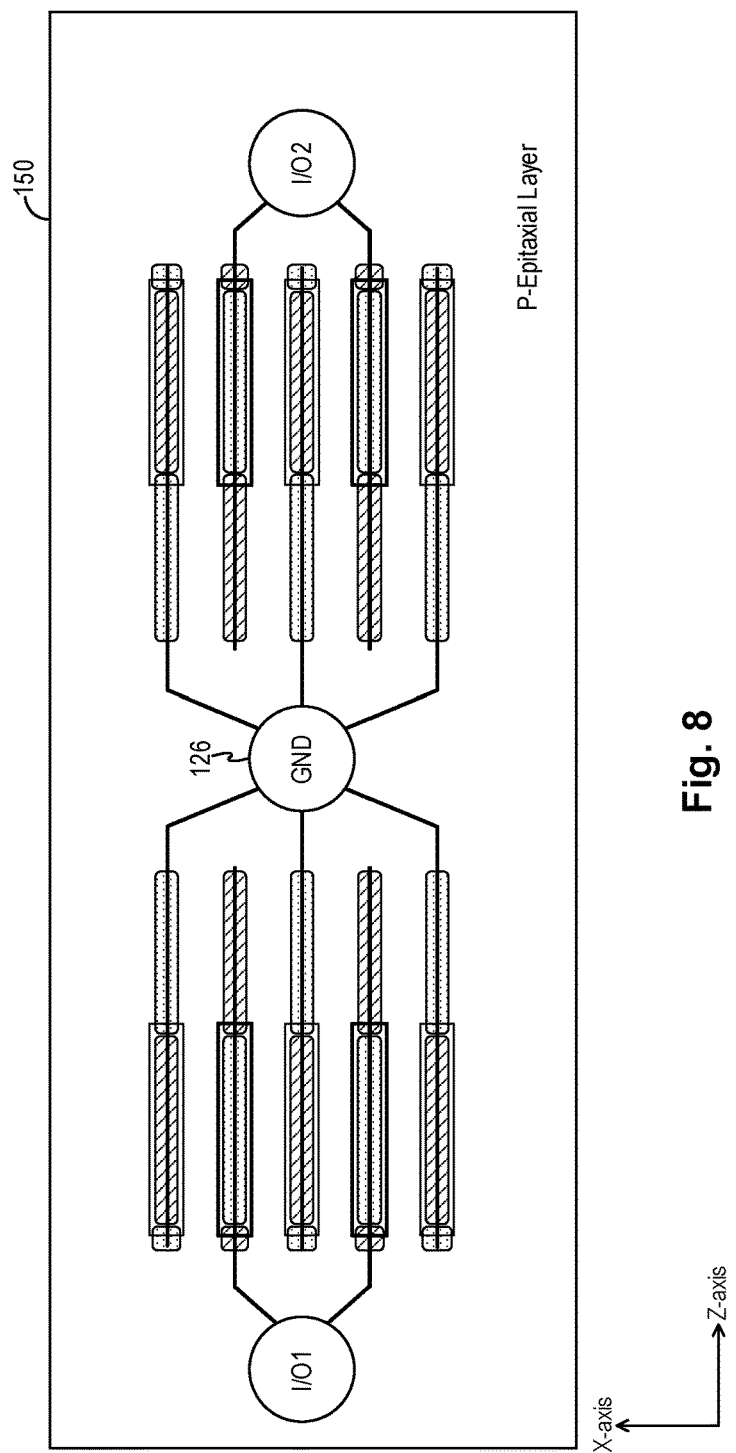
FIG. 8 is a top view of a low capacitance multi-channel TVS protection device in embodiments of the present invention.

In the embodiment shown in FIG. 7, the TVS device 100 is constructed as a unidirectional single channel TVS device. In other embodiments, the TVS device structure of FIG. 7 can be used as a core device unit to construct a multi-channel TVS protection device for multiple 110 terminals. FIG. 8 is a top view of a low capacitance multi-channel TVS protection device in embodiments of the present invention. Referring to FIG. 8, a multi-channel TVS protection device 150 for a pair of I/O terminals I/O1 and I/O2 is formed using the single-channel TVS device structure of FIG. 7 as a core device unit. In particular, the TVS device 150 is formed using a core device unit and a mirror image of a core device unit joined at the ground node 126. In some cases, the TVS device 150 may be configured as bi-directional multi-channel TVS device by using a floating node instead of a ground node. That is, node 126 can be grounded or floating (not connected to any electrical potential). In a bidirectional TVS device, the transient current flows from the I/O being zapped to the other I/O.

FIG. 9 is a detailed top view of a pair of fingers in the TVS protection device of FIG. 7 in some embodiments. Referring to FIG. 9, the TVS device 100 is formed using alternating P-Well fingers 115 and N-Well fingers 118 formed on the P-type epitaxial layer 102. In the P-Well finger 115, the first doped region is an N+ doped region 110 housed in the P-Well 104 and the second doped region is a P+ doped region 108 arranged lengthwise along the finger in the Z-axis. The P+ doped region 108 is formed in the P-type epitaxial layer 102 but overlaps the P-Well 104 by a small portion. The P+ doped region 108a is formed at the opposite end of the P-Well 104 to provide a symmetrical connection to the P-Well. Contacts 128 are formed on the P+ region 108a, the N+ region 110 and the P+ region 108. The metal line 122 is formed over the contacts 128 to connect to make an electrical connection to the P+ region 108a, the N+ region 110 and the P+ region 10 and to connect these semiconductor regions to the ground node.

In the N-Well finger 118, the first doped region is a P+ doped region 108 housed in the N-Well 106 and the second doped region is an N+ doped region 110 arranged lengthwise along the finger in the Z-axis. The N+ doped region 110 is formed in the P-type epitaxial layer 102 but overlaps the N-Well 106 by a small portion. The N+ doped region 110a is formed at the opposite end of the N-Well 106 to provide a symmetrical connection to the N-Well. Contacts 128 are formed on the N+ region 110a, the P+ region 108 and the N+ region 110. The metal line 120 is formed over the contacts 128 to connect to make an electrical connection to the N+ region 110a, the P+ region 108 and the N+ region 110 and to connect these semiconductor regions to the protected node (I/O terminal).

As thus configured, an SCR device is formed by the first doped regions and the well regions of two adjacent fingers. The P-N junction diode is formed by the second doped regions of two adjacent fingers. FIG. 10 is a cross-sectional view of a part of the TVS device of FIG. 9 along the A-A' axis in some embodiments. FIG. 10 illustrates the cross-section of the SCR device of the TVS device 100. FIG. 11 is a cross-sectional view of a part of the TVS device of FIG. 9 along the B-B' axis in some embodiments. FIG. 11 illustrates the cross-section of the P-N junction diode device of the TVS device 100.

Referring to FIGS. 10 and 11, the TVS device 100 is formed on a semiconductor substrate, such as P-type substrate 101 with a P-type epitaxial layer 102 formed thereon. Both the P-type substrate 101 and the P-type epitaxial 102 can be very lightly doped. As shown in FIG. 10, the SCR device is formed in the first doped regions and the respective well regions of two adjacent fingers. In particular, the SCR device is formed by the P+ doped region 108 and the N-Well 106 of the N-Well finger 118, and the P-Well 104 and the N+ region 110 of the P-Well finger 115. The P+ doped region 108 is connected by the contact 128 and the metal line 120 to the protected node (I/O terminal). The N+ doped region 110 is connected by the contact 128 and the metal line 122 to the ground node. Meanwhile, along the fingers in the orthogonal axis (Z-axis), the P-N junction diode is formed by the second doped regions. In particular, the P-N junction diode is formed by the P+ doped region 108 and the N+ doped region 110 formed in the P-type epitaxial layer 102, without any well regions. The P+ doped region 108 is connected by the contact 128 and the metal line 122 to the to the ground node. The N+ doped region 110 is connected by the contact 128 and the metal line 120 to the protected node (I/O terminal).

FIG. 12 is a detailed top view of a pair of fingers in a TVS protection device in an alternate embodiment. Referring to FIG. 12, the TVS device 160 is constructed in the same manner as the TVS device 100 of FIG. 7 except for the well regions. In TVS device 100, the well regions are constructed predominantly to house the first doped regions. In the embodiment of the TVS device 160 shown in FIG. 12, both the N-Well 106 and the P-Well 104 are extended to house the second doped regions as well. In particular, the P-Well 104 is extended to house the N+ doped region 110 as well as the P+ doped region 108. Meanwhile, the N-Well 106 is extended to house the P+ doped region 108 as well as the N+ doped region 110. The remaining structure of TVS device 160 is the same as the TVS device 100 of FIG. 7.

FIG. 13 is a cross-sectional view of a part of the TVS device of FIG. 12 along the A-A' axis in some embodiments. FIG. 13 illustrates the cross-section of the SCR device of the TVS device 160. FIG. 14 is a cross-sectional view of a part of the TVS device of FIG. 12 along the B-B' axis in some embodiments. FIG. 14 illustrates the cross-section of the P-N junction diode device of the TVS device 160. As thus constructed the SCR device in TVS device 160 has the same device structure as TVS device 100, as shown in FIG. 10. However, the P-N junction diode in TVS device 160 is formed with the P+ doped region 108 formed in a P-Well 104 and the N+ doped region 110 formed in an N-Well 106. The TVS device 160 illustrates an alternate embodiment of the TVS device 100 whereby the N-Wells and P-Wells of the fingers can be extended to house both the first and second doped regions in each finger.

Figure 15:
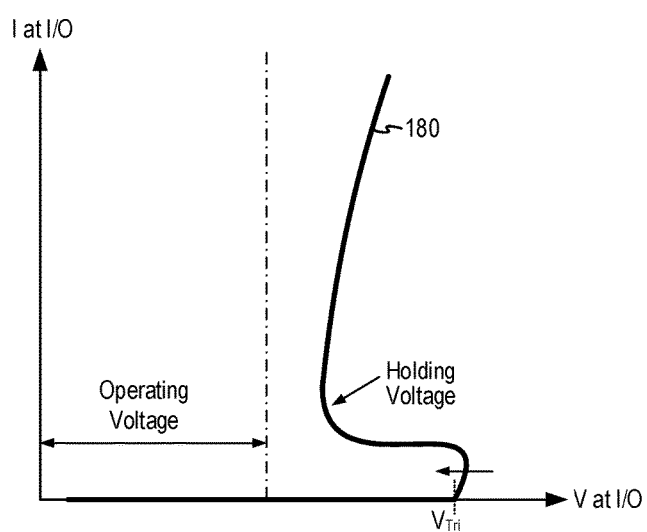
FIG. 15 illustrates the current-voltage characteristics of the TVS protection device in embodiments of the present invention.

FIG. 15 illustrates the current-voltage characteristics of the TVS protection device in embodiments of the present invention. Referring to FIG. 15, the curve 180 depicts the reverse current conducted through the TVS device versus voltage applied at the protected node. In normal operation, the voltage at the protected node should be within the operating voltage range and the TVS device is in blocking mode, not conducting any current except for leakage current. If the voltage at the protected node reaches a trigger voltage of the TVS device, the TVS device is turned on to conduct the excess current. The SCR of the TVS device clamps the voltage at the protected node at the holding voltage while the TVS device conducts current safely out of the protected node. In some cases, it may be desirable to adjust the trigger voltage of the TVS device so as to make the TVS device more sensitive to voltage surge. In embodiments of the present invention, the TVS device incorporates structures to enable the trigger voltage of the TVS device to be tuned to the desired voltage level while preserving the low parasitic capacitance characteristics of the TVS device.

Figures 16, 16A:
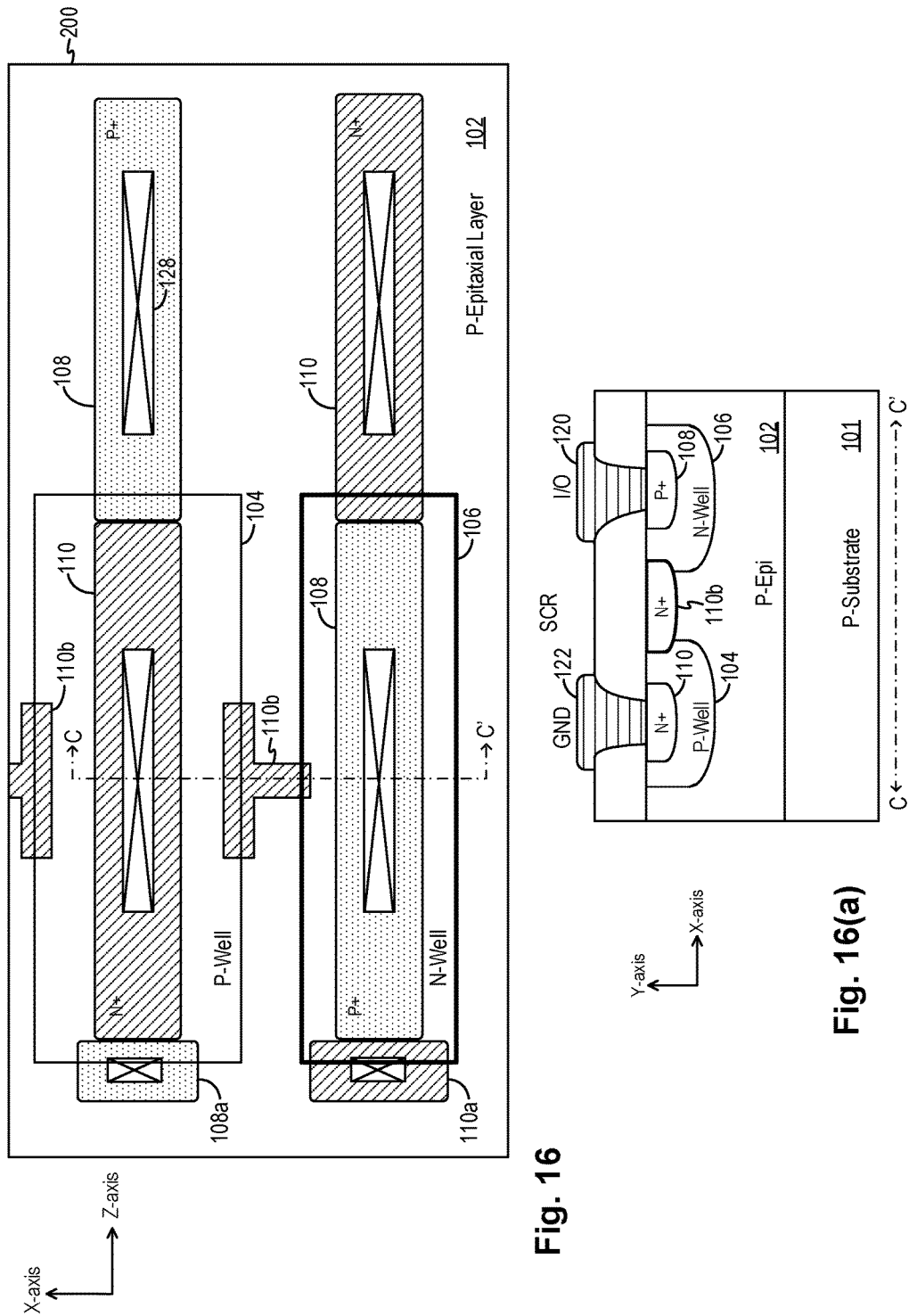
FIG. 16, which includes
FIG. 16(a), is a top view of a TVS device incorporating trigger voltage adjust structure in some embodiments of the present invention.

FIG. 16, which includes FIG. 16(a), is a top view of a TVS device incorporating trigger voltage adjust structure in some embodiments of the present invention. Referring to FIG. 16, a TVS device 200 is constructed in a similar manner as the TVS device 100 of FIG. 7. Like elements in FIGS. 7 and 16 are given like reference numerals and will not be further described. To enable tuning or adjustment of the trigger voltage, the TVS device 200 incorporates an N+ to P-Well structure for trigger voltage adjustment. The TVS device 200 includes an N+ doped region 110b formed in the current conducting region between adjacent P-Well and N-Well fingers as the trigger voltage adjust structure. In the present embodiment, the N+ doped region 110b occupies only a small portion of the length of the P-Well so as not to introduce excessive parasitic capacitance to the protected node. The N+ doped region 110b includes a first portion that overlaps the P-Well 104 and a second portion that extends through the current conducting region and overlaps the N-Well 106. Accordingly, the N+ doped region 110b is biased to the N-Well voltage and bridges the N-Well voltage to the P-Well 104. FIG. 16(a) is a cross-sectional view of a part of the TVS device of FIG. 16 along the C-C' axis in some embodiments. Referring to FIG. 16(a), the additional N+ doped region 110b connects the N-Well voltage to the P-Well 104 which has the effect of lowering the trigger voltage. Meanwhile, the TVS device 200 maintains low parasitic capacitance.

In the TVS device 200, the width of the P-Well 104 may be extended so as to increase the distance between the N+ doped region 110b and the N+ region 110 housed in the P-Well 104. The increased distance has the effect of preventing punch-through between the two N+ doped regions.

In the present embodiment, the N+ doped region 110b is configured in a T-shape with the lateral portion of the N+ doped region overlapping the P-Well 104 and the narrow elongated portion of the N+ doped region extending over the current conducting region and overlapping the N-Well 106. In an alternate embodiment, the N+ doped region 110b can include only the long overlapping region over the P-Well and the N+ doped region 110b can be electrically connected to the N-Well 106 through other means, such as a contact and a metal line.

In an alternate embodiment, the TVS device can incorporate a P+ doped region overlapping the N-Well as a trigger voltage adjust structure. The P+ doped region is biased to the P-Well potential.

Figure 17:
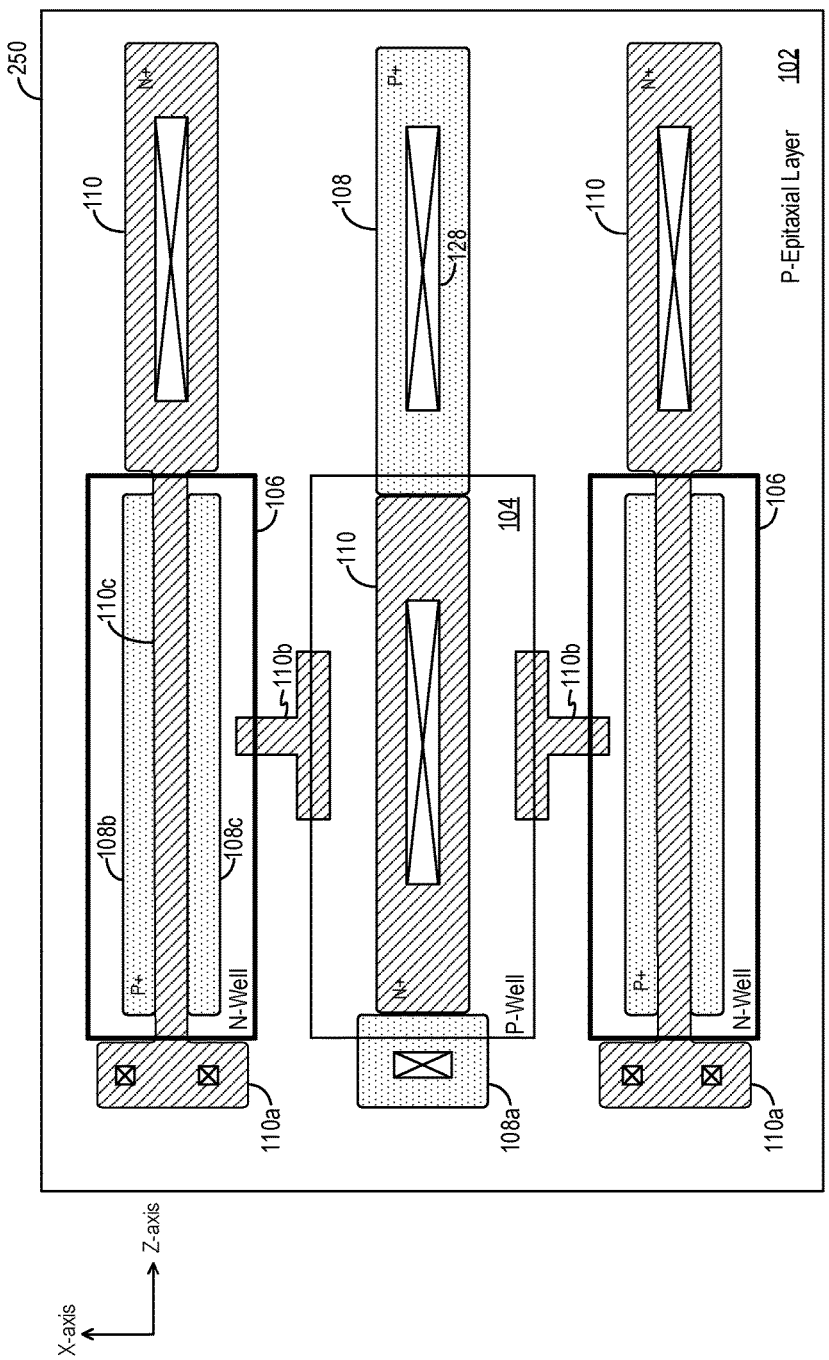
FIG. 17 is a top view of a TVS device incorporating trigger voltage adjust structure in alternate embodiments of the present invention.

FIG. 17 is a top view of a TVS device incorporating trigger voltage adjust structure in alternate embodiments of the present invention. Referring to FIG. 17, a TVS device 250 is constructed in a similar manner as the TVS device 200 of FIG. 16 and incorporates the N+ doped region 110b as the trigger voltage adjust structure. In the embodiment shown in FIG. 17, the N-Well fingers are constructed using split P+ doped regions. More specifically, the P+ doped region formed in the N-Well 106 are split into a first P+ doped region 108b and a second P+ doped region 108c. Furthermore, the N+ doped region 110, which normally overlaps the N-Well 106, may include an elongated portion 110c extended through the N-Well and connecting to the N+ doped region 110a at the other end of the N-Well. In particular, the N+ doped region 110c may be arranged between the first and second P+ doped regions 108b and 108c. The split P+ doped regions have the effect of improving the holding voltage of the TVS device by reducing the base resistance of the N-Well. In other embodiments, the TVS device can be formed by splitting the N+ doped region into two and extending the P+ doped region between the split N+ doped regions, as shown in FIG. 25.

Figure 25:
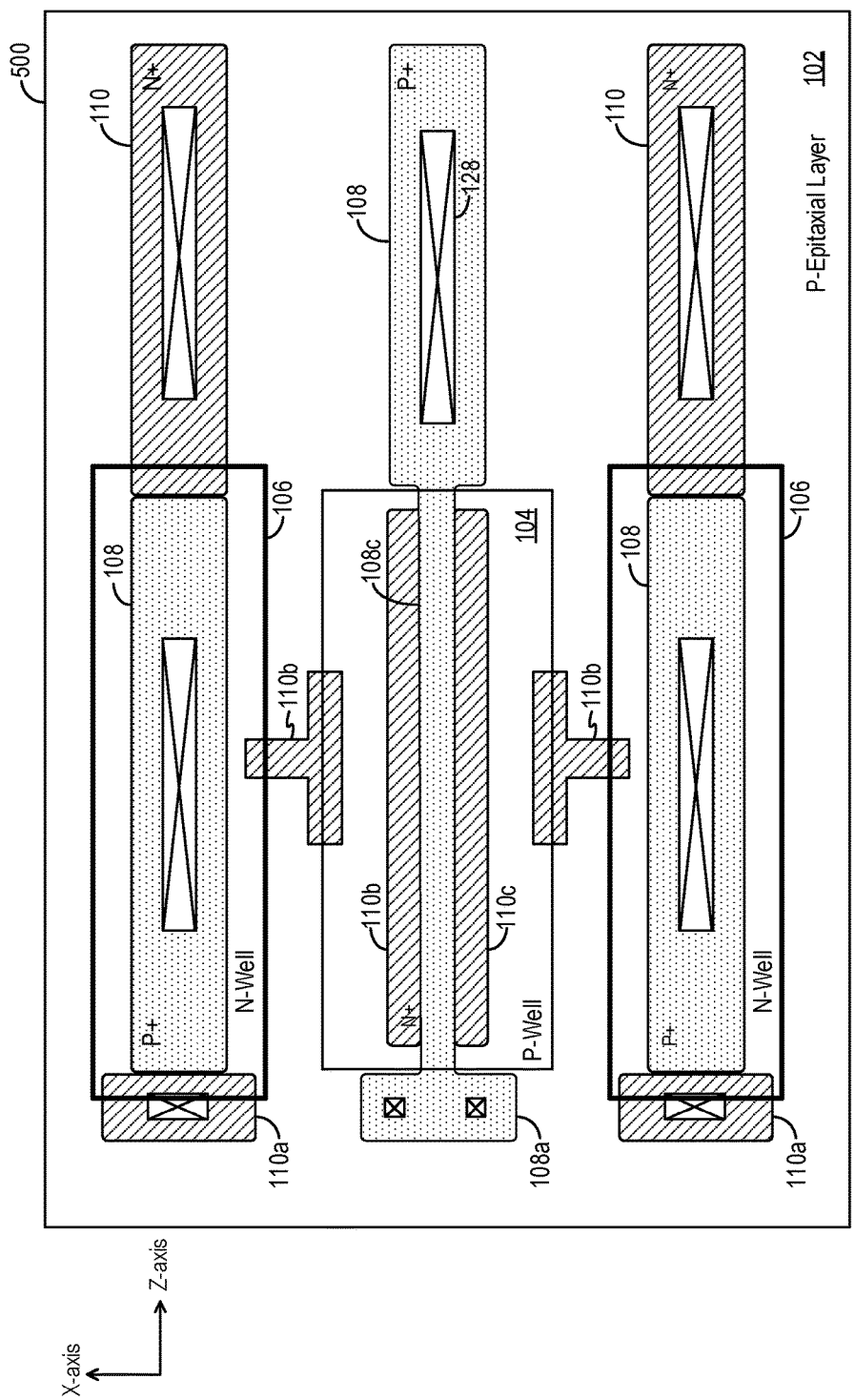
FIG. 25 is a top view of a TVS device incorporating trigger voltage adjust structure in alternate embodiments of the present invention.

FIG. 25 is a top view of a TVS device incorporating trigger voltage adjust structure in alternate embodiments of the present invention. Referring to FIG. 25, a TVS device 500 is constructed in a similar manner as the TVS device 250 of FIG. 17 and incorporates the N+ doped region 110b as the trigger voltage adjust structure. In the embodiment shown in FIG. 25, the P-Well fingers are constructed using split N+ doped regions. More specifically, the N+ doped region formed in the P-Well 104 are split into a first N+ doped region 110b and a second N+ doped region 110c. Furthermore, the P+ doped region 108, which normally overlaps the P-Well 104, may include an elongated portion 108c extended through the P-Well and connecting to the P+ doped region 108a at the other end of the P-Well. In particular, the P+ doped region 108c may be arranged between the first and second N+ doped regions 110b and 110c. The split N+ doped regions have the effect of improving the holding voltage of the TVS device by reducing the base resistance of the P-Well.

Figure 18:
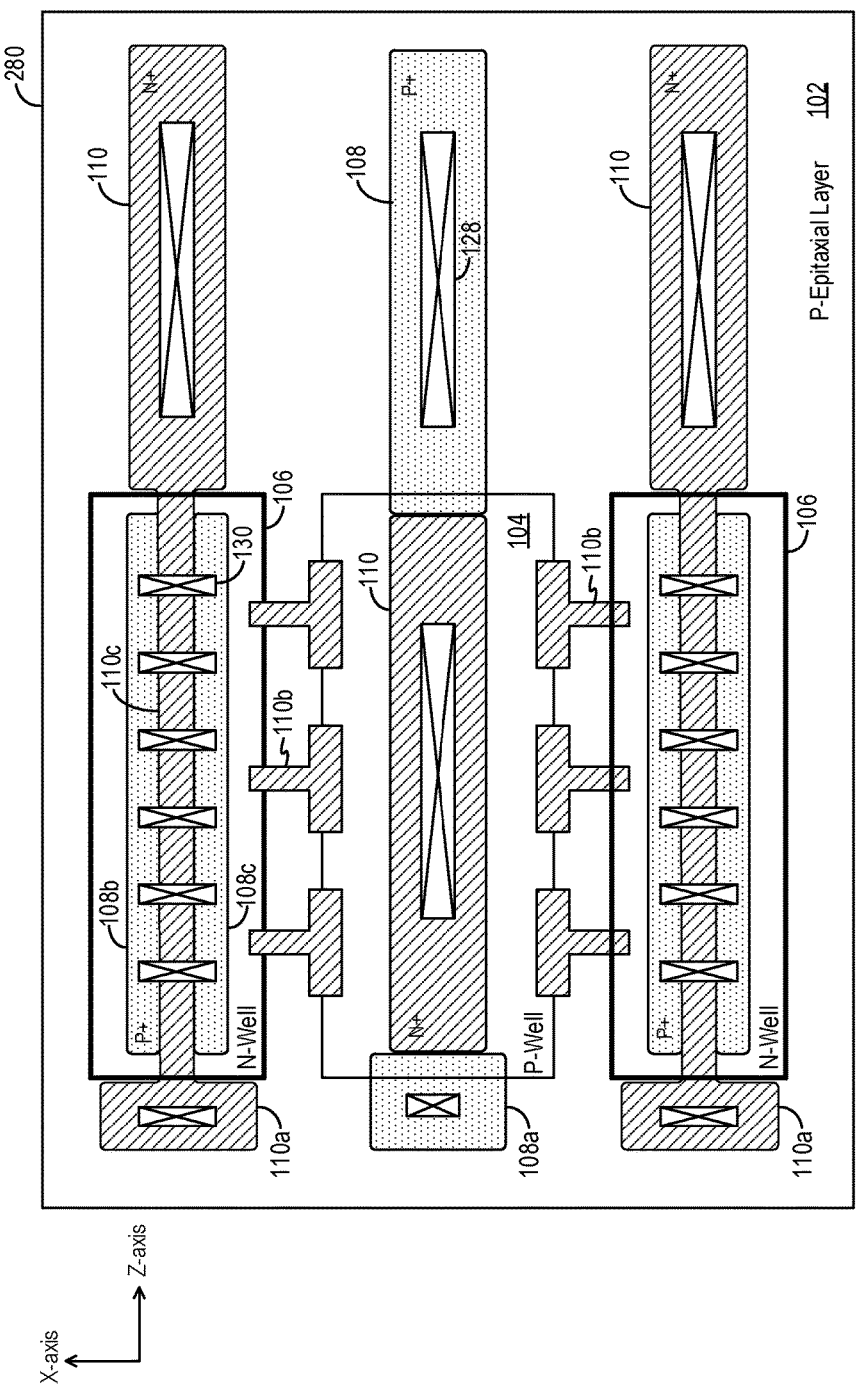
FIG. 18 is a top view of a TVS device incorporating trigger voltage adjust structure in alternate embodiments of the present invention.

FIG. 18 is a top view of a TVS device incorporating trigger voltage adjust structure in alternate embodiments of the present invention. Referring to FIG. 18, a TVS device 280 is constructed in a similar manner as the TVS device 250 of FIG. 17 and incorporates the N+ doped region 110b as the trigger voltage adjust structure. Furthermore, TVS device 280 incorporates an array of the trigger voltage adjust structures 110b. TVS device 280 illustrates the use of the trigger voltage adjust structures to tune or adjust the trigger voltage of the TVS device. One or more of the trigger voltage adjust structures 110b can be used to obtain the desired trigger voltage. Moreover, the TVS device 280 illustrates the use of butting contacts 130 in the N-Well fingers to electrically connect the P+ doped regions 108b and 108C to the N+ region 110c running between the two P+ doped regions. The butting contacts are connected to an overlaying metal lines to connect the N-Well fingers to the protected node. The split P+ doped regions and the butting contacts have the effect of reducing the base resistance which increases the holding voltage of the TVS device.

Figure 19:
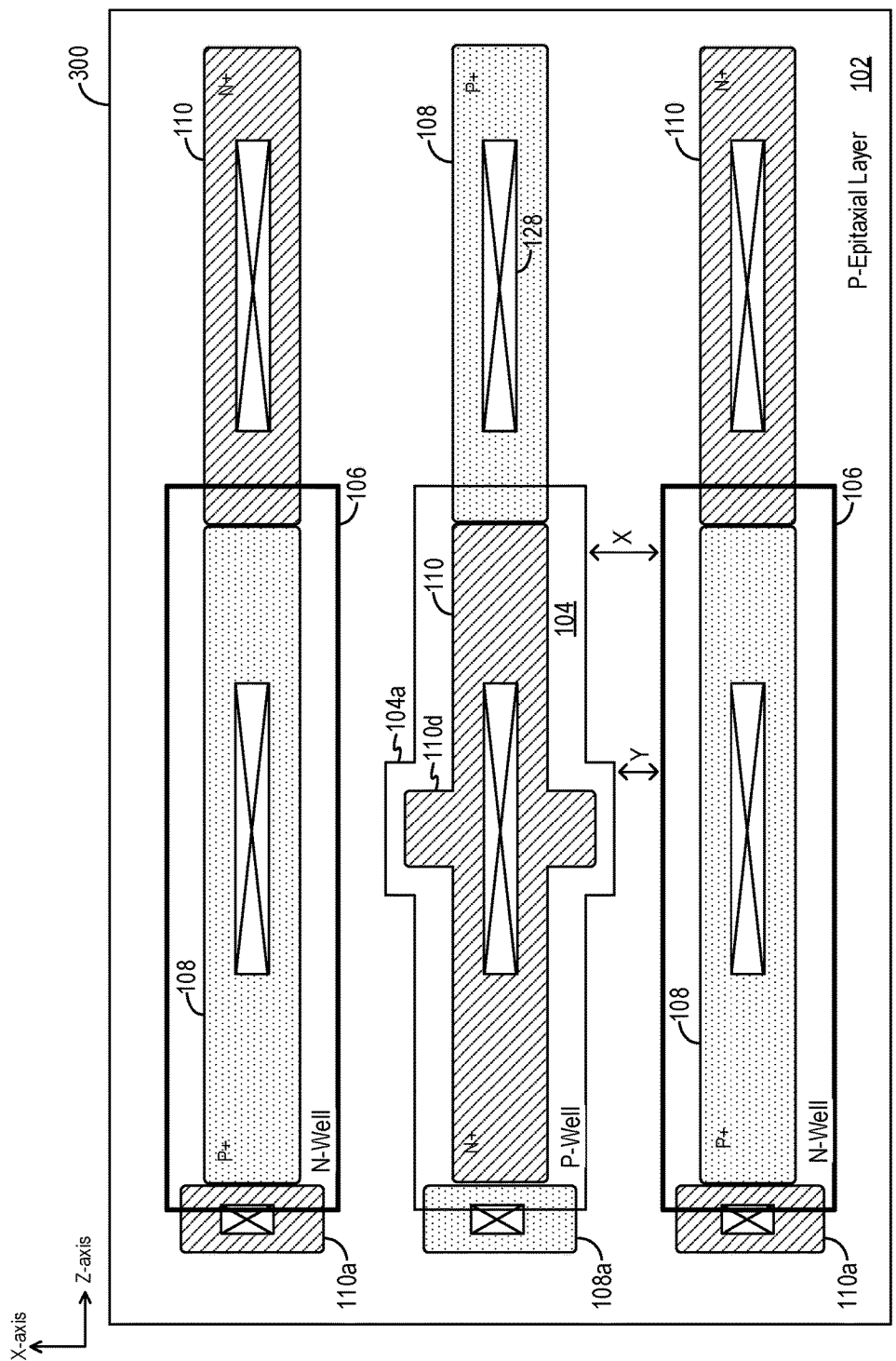
FIG. 19 is a top view of a TVS device incorporating trigger voltage adjust structure in alternate embodiments of the present invention.

FIG. 19 is a top view of a TVS device incorporating trigger voltage adjust structure in alternate embodiments of the present invention. Referring to FIG. 19, a TVS device 300 is constructed in a similar manner as the TVS device 100 of FIG. 7. Like elements in FIGS. 7 and 19 are given like reference numerals and will not be further described. To enable tuning or adjustment of the trigger voltage, the TVS device 300 incorporates a P-Well to N-Well spacing structure for trigger voltage adjustment. In particular, the TVS device 300 includes a P-Well 104 with an extension portion 104a and an N+ doped region 110 with an extension portion 110d as the trigger voltage adjust structure. The extension portions 104a and 110d extend a portion of the N+ doped region and the P-Well into the current conduction region between the P-Well finger and the N-Well finger. Accordingly, a localized region of narrow spacing (distance "Y") between two adjacent fingers is formed where the normal spacing between two adjacent fingers is denoted as distance "X".

With the N+ doped region 110d extended towards the N-well 106, the NPN transistor formed in this region will turn-on first which has the effect of lowering the trigger voltage. In particular, the NPN transistor is formed by the N-well 106 as the collector, the P-well 104 as the base and the N+ extended doped region 110d as the emitter. Meanwhile, the TVS device 300 maintains low parasitic capacitance.

In the present embodiment, the N+ doped region and the P-Well are extended only locally—that is, for a small portion of the length of the P-Well. For example, the extension portions may be 15-30% of the length of the P-Well. In other embodiments, the entire length of the P-Well and N+ doped region may be extended towards the adjacent N-Well. In other words, the spacing between the P-Well finger and the N-Well finger can be reduced to improve the trigger voltage.

Furthermore, in the present embodiment, the N+ doped region and the P-Well are extended locally to reduce the spacing to the N-Well. In other embodiments, the extension portions can be formed using the N-Well and the P+ region housed therein. That is, the P+ region and the N-Well can include extension portions to reduce the localized spacing between the well regions of two adjacent fingers.

Figure 20:
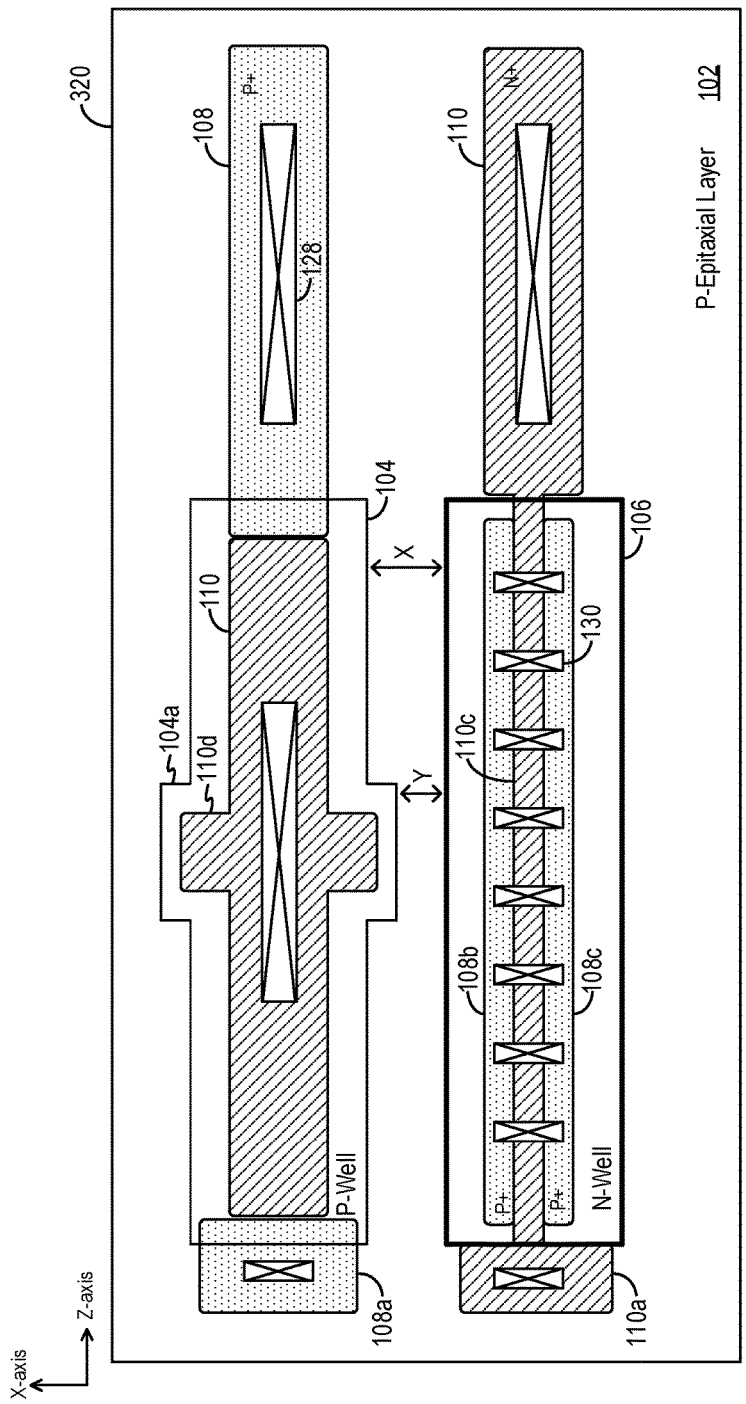
FIG. 20 is a top view of a TVS device incorporating trigger voltage adjust structure in alternate embodiments of the present invention.

FIG. 20 is a top view of a TVS device incorporating trigger voltage adjust structure in alternate embodiments of the present invention. Referring to FIG. 20, a TVS device 320 is constructed in a similar manner as the TVS device 300 of FIG. 19 and incorporates an N+ doped region extension portion 110d and a P-Well extension portion 104a as the trigger voltage adjust structure. TVS device 320 further illustrates the use of split P+ doped regions 108b, 108c in the adjacent N-Well fingers. In the N-Well finger, the N+ doped region 110 extends through the N-Well to connect to the N+ doped region 110a. TVS device 320 also illustrates the use of butting contacts 130 to electrically connect the P+ doped regions 108b and 108c to the N+ region 110 in the N-Well 106.

Figure 21:
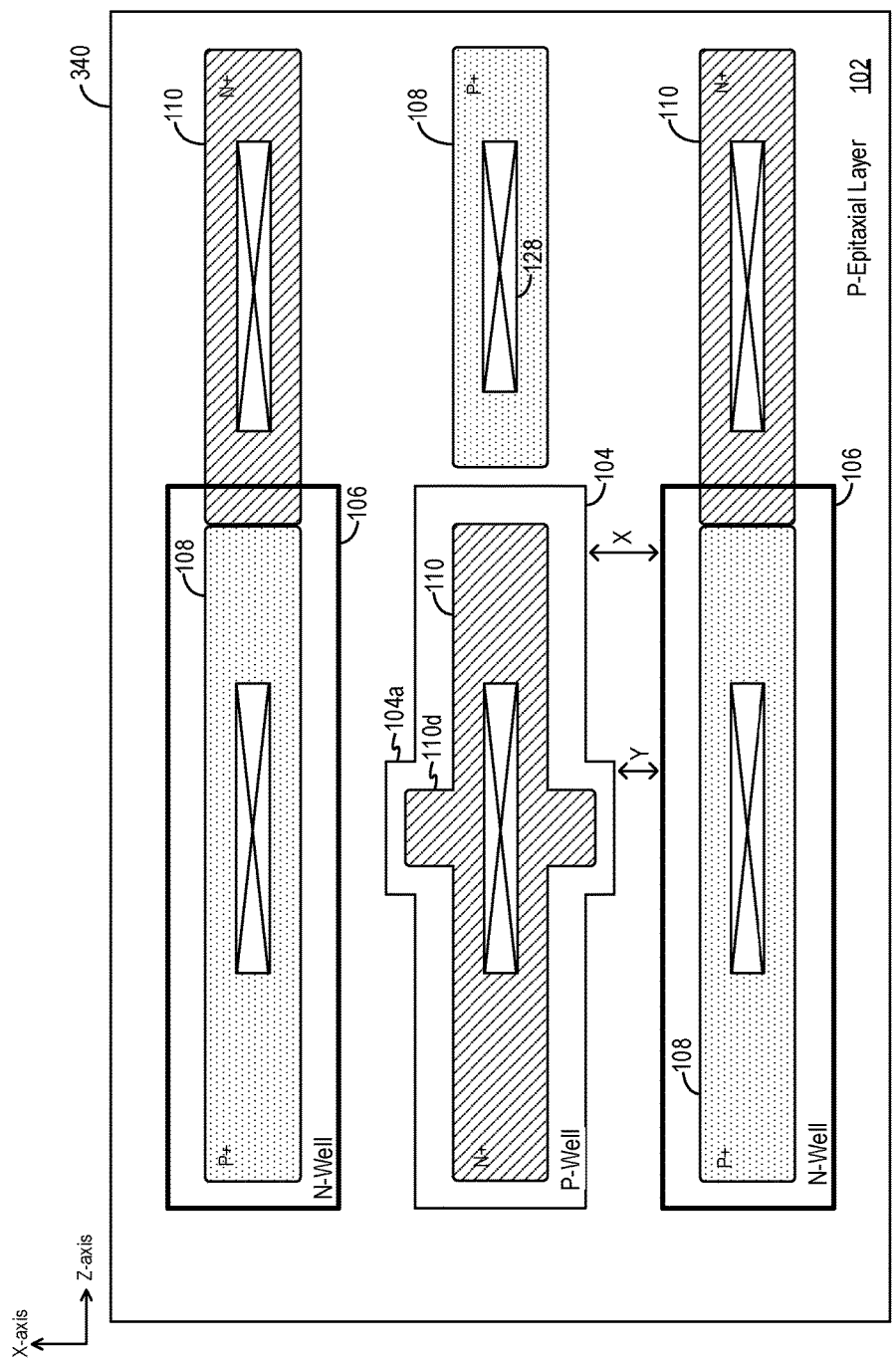
FIG. 21 is a top view of a TVS device incorporating trigger voltage adjust structure in alternate embodiments of the present invention.

FIG. 21 is a top view of a TVS device incorporating trigger voltage adjust structure in alternate embodiments of the present invention. Referring to FIG. 21, a TVS device 34 is constructed in a similar manner as the TVS device 300 of FIG. 19 and incorporates an N+ doped region extension portion 110d and a P-Well extension portion 104a as the trigger voltage adjust structure. In the present embodiment, the TVS device 340 is constructed without the N+ doped regions 110a and the P+ doped regions 108a for the well connection at the end of the well regions away from the second doped regions. In this case, the N-Well 106 is connected to the N+ region 110 at the overlapped area. The N-Well is therefore biased to the N+ region 110 only at one end of the well region. The well resistance is thus increased. Increasing the N-Well resistance increase the base resistance of the NPN bipolar transistor of the SCR device which improves the trigger voltage of the SCR. Meanwhile, in the P-Well finger, the P+ region 108 does not overlap the P-Well 104. The P-Well 104 is connected to the P+ region 108 through the resistance of the underlying P-type epitaxial layer 102. The P-Well resistance is thus increased which improves the trigger voltage of the SCR.

Figure 22:
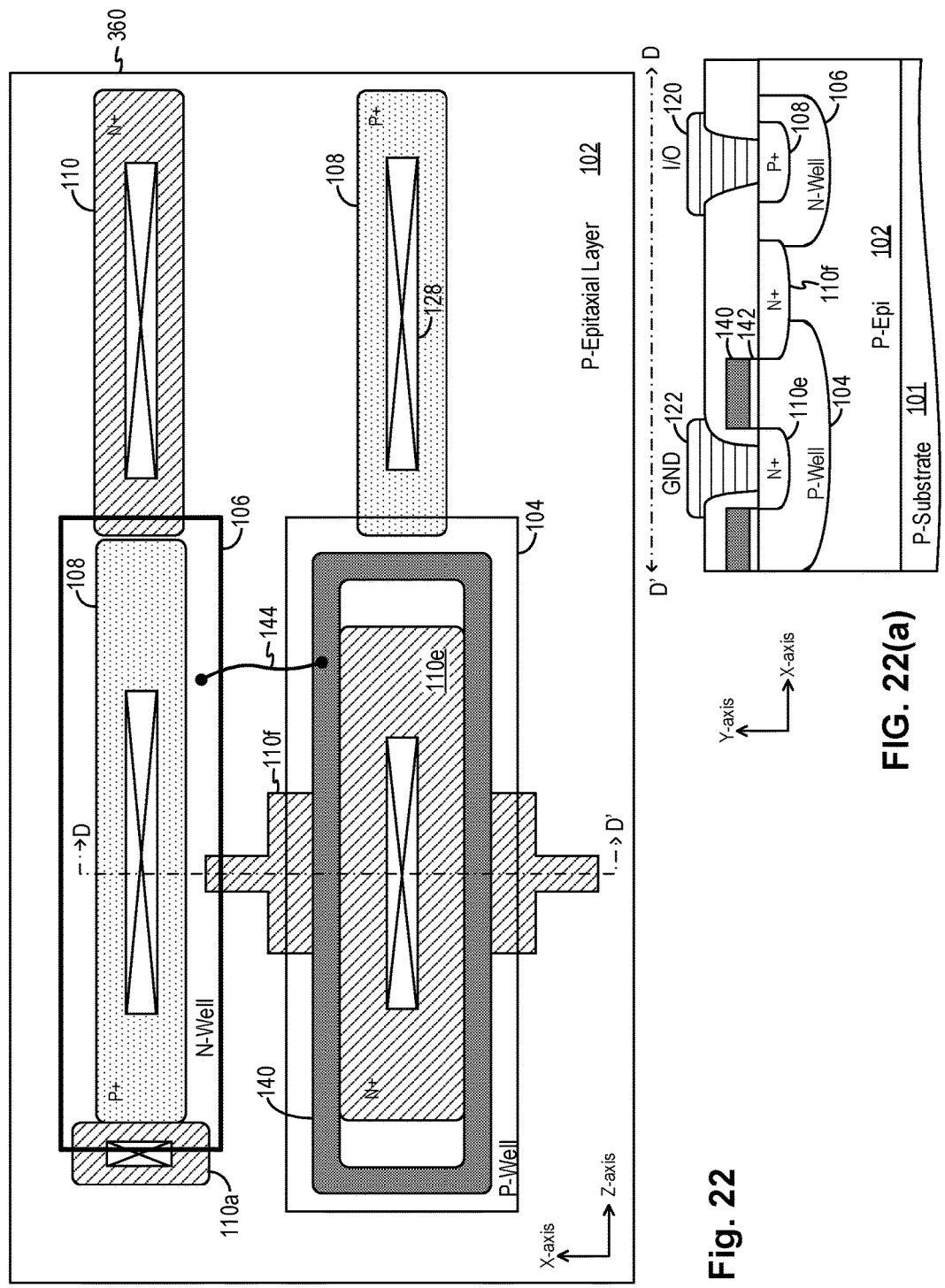
FIG. 22, which includes

In alternate embodiments of the present invention, the TVS device incorporates a MOS trigger adjust structure. FIG. 22, which includes FIG. 22(a), is a top view of a TVS device incorporating a MOS trigger voltage adjust structure in some embodiments of the present invention. Referring to FIG. 22, a TVS device 360 is constructed in a similar manner as the TVS device 100 of FIG. 7. Like elements in FIGS. 7 and 22 are given like reference numerals and will not be further described. To enable tuning or adjustment of the trigger voltage, the TVS device 360 incorporates a MOS transistor for trigger voltage adjustment. The TVS device 360 includes a polysilicon gate 140 formed in a race track structure surrounding the N+ doped region 110e, all formed in a P-Well 104. The polysilicon gate 140 is formed over a gate oxide layer (not shown) that is formed over the surface of the epitaxial layer 102. The N+ doped region 110e formed inside the polysilicon gate 140 forms the source of the MOS transistor. An N+ doped region 110f formed outside of the polysilicon gate 140 and overlapping the P-Well 104 form the drain of the MOS transistor. The N+ doped region 110f includes a first portion that overlaps the P-Well 104 and a second portion that extends through the current conducting region and overlaps the adjacent N-Well 106. As thus constructed, an MOS transistor is formed by the N+ doped regions 110e and 110f between the polysilicon gate 140. The drain of the MOS transistor, the N+ doped region 110f is biased to the N-Well voltage by virtue of the overlap to the N-Well 106.

FIG. 22(a) is a cross-sectional view of a part of the TVS device of FIG. 22 along the D-D' axis in some embodiments. Referring to FIG. 22(a), the MOS transistor trigger structure is formed by the polysilicon gate 140 insulated from the P-type epitaxial layer 102 by a gate oxide layer 142. The polysilicon gate 140 is formed over the P-Well 104 which functions as the body region of the MOS transistor. The N+ doped region 110e functions as the source of the MOS transistor. The N+ doped region 110f, overlapping the P-Well 104 and extends through the current conducting region to overlap with the N-Well 106. The N+ doped region 110f functions as the drain of the MOS transistor and is electrically connected to the N-Well potential.

The polysilicon gate 140 is electrically connected to the N-Well potential (as depicted by the line 144). The physical connection between the polysilicon gate 140 and the N-Well can be accomplished through various means. For example, a conductive line, such as polysilicon or metal, may be used to connect the polysilicon gate 140 to the N-Well. Because the polysilicon gate is electrically connected to the N-Well potential, the gate of the MOS transistor is thus shorted to the drain since the drain is also connected to the N-Well potential. As thus constructed, current flows from the N+ source 110e to the N+ drain 110f under the control of the polysilicon gate 140. In this manner, the trigger voltage of the SCR can be tailored or adjusted.

Figure 23:
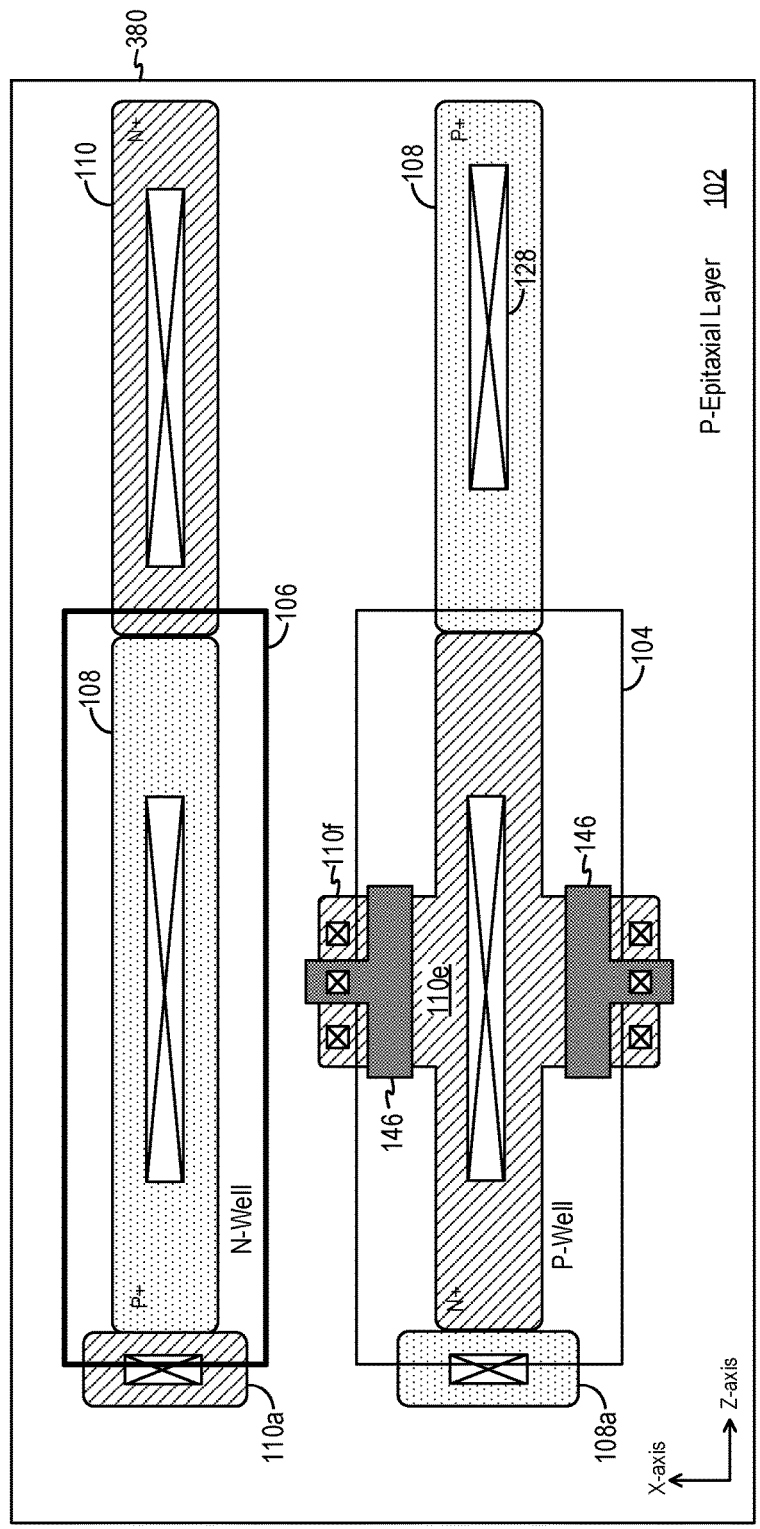
FIG. 23 is a top view of a TVS device incorporating a MOS trigger voltage adjust structure in alternate embodiments of the present invention.

FIG. 23 is a top view of a TVS device incorporating a MOS trigger voltage adjust structure in alternate embodiments of the present invention. Referring to FIG. 23, a TVS device 380 is constructed in a similar manner as the TVS device 360 of FIG. 22 and incorporates an MOS transistor as the trigger voltage adjust structure. In the embodiment shown in FIG. 23, the polysilicon gate of the MOS transistor is formed as a localized structure instead of a race track. In the present embodiment, the polysilicon gate 146 is formed as a T-shape structure including a lateral portion formed in the P-Well 104 which forms the body of the MOS transistor and an elongated extension protruding into the current conducting region between the P-Well finger and the N-Well finger. The N+ region 110 housed in the P-Well 104 includes an extension 110e to reach the inner edge of the polysilicon gate 146. The N+ doped region 110e forms the source of the MOS transistor. Another N+ doped region 110f is formed on the opposite side of the polysilicon gate 146 to form the drain of the MOS transistor. Contacts can be formed on the drain region 110f and the polysilicon gate 146 to electrically connect the drain to the gate of the MOS transistor.

In the embodiment shown in FIG. 23, the N+ doped region 110f does not reach the N-Well 106 of the adjacent finger. However, in operation, the depletion region of the N-Well 106 will reach the N+ doped region 110f to bias the N+ doped region 110f to the N-Well potential.

Figure 24:
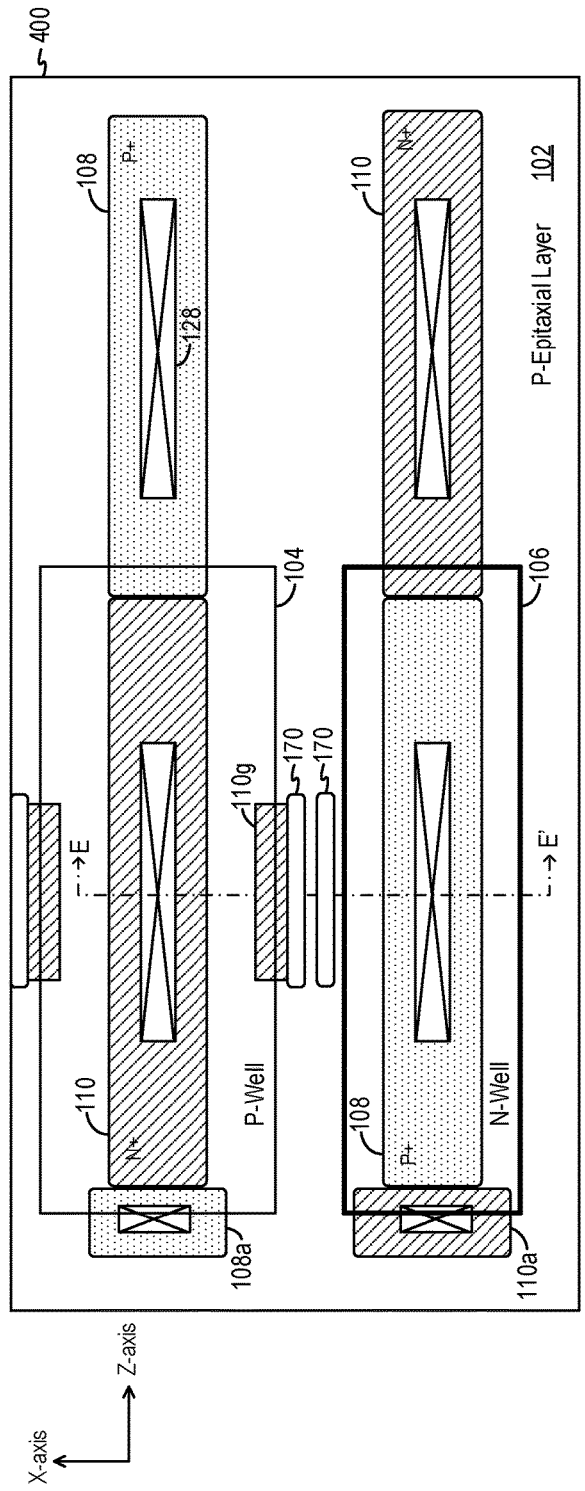
FIG. 24, which includes
Figure 24A:
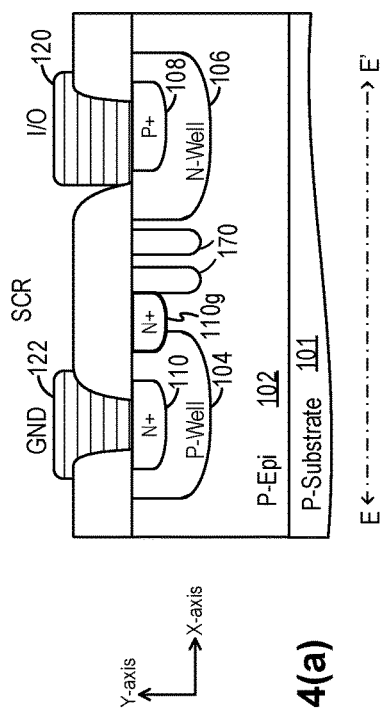
FIG. 24(a), is a top view of a TVS device incorporating trigger voltage adjust structure in some embodiments of the present invention.

FIG. 24, which includes FIG. 24(a), is a top view of a TVS device incorporating trigger voltage adjust structure in some embodiments of the present invention. Referring to FIG. 24, a TVS device 400 is constructed in a similar manner as the TVS device 100 of FIG. 7. Like elements in FIGS. 7 and 24 are given like reference numerals and will not be further described. To enable tuning or adjustment of the trigger voltage, the TVS device 400 incorporates an N+ to P-Well structure for trigger voltage adjustment. More specifically, the TVS device 400 includes an N+ doped region 110g formed in the current conducting region overlapping the P-Well 104 as the trigger voltage adjust structure. In the present embodiment, the trigger voltage adjust structure includes one or more dielectric-filled trenches 170 arranged adjacent the N+ doped region 110g in the direct path between the N+ doped region 110g and the adjacent N-Well 106. In some embodiments, the trenches 170 are filled with silicon oxide or silicon nitride. FIG. 24(a) is a cross-sectional view of a part of the TVS device of FIG. 24 along the E-e' axis in some embodiments. Referring to FIG. 24(a), the N+ doped region 110g is formed overlapping the P-Well 104 but does not connect to the N-Well 106. Instead, trenches 170 are formed to isolate the N+ doped region 110g from the N-Well in the direct path between the N+ doped region 110g and the N-Well 106.

The trenches 170, positioned in the direct path between the N+ doped region 110g and the N-Well 106 has the effect of reducing the parasitic capacitance at the protected node. Although the N+ doped region 110g is not directly connected to the N-Well 106, in operation, the depletion region of the N-Well 106 will reach the N+ doped region 110g around the outside edge of the N+ doped region, in the indirect path, to bias the N+ doped region 110g to the N-Well potential.

In the above-described embodiments, the split P+ doped regions and the use of butting contacts are described in conjunction with the several trigger voltage adjust structures. In other embodiments, the split P+ doped regions or split N+ doped region or the use of butting contacts can be used independently in the TVS device without the use of the trigger voltage adjust structures.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A transient voltage suppressing (TVS) device comprising:
    a first finger of semiconductor regions and a second finger of semiconductor regions arranged laterally along a first direction on a major surface of a semiconductor layer and adjacent to each other laterally in the semiconductor layer, the first finger and second finger extending in a second direction orthogonal to the first direction on the major surface of the semiconductor layer, the semiconductor regions in a first portion of the first and second fingers forming a silicon controlled rectifier and the semiconductor regions in a second portion of the first and second fingers forming a P-N junction diode, the first and second fingers defining a current conducting region between the fingers;
    the first finger comprising a first doped region of a first conductivity type housed in a well region of a second conductivity type opposite the first conductivity type, and a second doped region of the second conductivity type arranged lengthwise in the first finger in the second direction; and
    the second finger comprising a first doped region of the second conductivity type housed in a well region of the first conductivity type, and a second doped region of the first conductivity type arranged lengthwise in the second finger in the second direction.

2. The TVS device of claim 1, wherein the current conducting region of the first and second fingers includes a first current path of the silicon controlled rectifier and a second current path of the P-N junction diode, the first current path of the silicon controlled rectifier being separated from the second current path of the P-N junction diode in the current conducting region in the second direction orthogonal to the first direction on the major surface of the semiconductor layer.

3. The TVS device of claim 1, wherein the first doped regions and the well regions of the first and second fingers form the silicon controlled rectifier and the second doped regions of the first and second fingers form the P-N junction diode.

4. The TVS device of claim 1, wherein the semiconductor regions of the first finger of the first type are electrically connected to a reference node and the semiconductor regions of the second finger are electrically connected to a protected node.

5. The TVS device of claim 1, wherein the second doped region of the first finger overlaps the well region of the first finger at a first end of the well region; and the second doped region of the second finger overlaps the well region of the second finger at a first end of the well region.

6. The TVS device of claim 5, wherein the first finger further comprises a third doped region of the second conductivity type formed overlapping the well region at a second end of the well region, the second end being opposite the first end lengthwise along the first finger; and wherein the second finger further comprises a fourth doped region of the first conductivity type formed overlapping the well region at a second end of the well region of the second finger, the second end being opposite the first end lengthwise along the second finger.

7. The TVS device of claim 1, wherein the first doped region of the second finger comprises a pair of separated doped regions arranged laterally in the first direction and extending lengthwise in the second direction in the well region of the second finger.

8. The TVS device of claim 7, wherein:
    the second doped region of the first finger overlaps the well region of the first finger at a first end of the well region; and
    the second doped region of the second finger further comprises an extended portion extending through the well region between the pair of separated doped regions in the second finger; the extended portion of the second doped region extending from a first end of the well region to a second end of the well region of the second finger, the second end being opposite the first end lengthwise along the second finger.

9. The TVS device of claim 8, further comprising:
    in the second finger, a plurality of butting contacts formed over and connected to the pair of separated doped regions and the extended portion of the second doped region formed therebetween.

10. The TVS device of claim 8, wherein the first finger further comprises a third doped region of the second conductivity type formed overlapping the well region at a second end of the well region, the second end being opposite the first end lengthwise along the first finger; and wherein the second finger further comprises a fourth doped region of the first conductivity type formed outside a second end of the well region of the second finger and connected to the extended portion of the second doped region of the second finger, the second end being opposite the first end lengthwise along the second finger.

11. The TVS device of claim 7, further comprising:
    a fifth doped region of the first conductivity type formed in the current conducting region between the first finger and the second finger, the fifth doped region having a first portion overlapping the well region of the first finger and a second portion overlapping the well region of the second finger.

12. The TVS device of claim 11, further comprising:
    a plurality of fifth doped region formed in the current conducting region between the first finger and the second finger.

13. The TVS device of claim 1, wherein the semiconductor layer comprises a semiconductor substrate and an epitaxial layer of the second conductivity type formed on the semiconductor substrate, the epitaxial layer being lightly doped.

14. The TVS device of claim 1, wherein the first conductivity type comprises N-type conductivity and the second conductivity type comprises P-type conductivity.

15. The TVS device of claim 1, wherein the well region in each of the first and second fingers is extended to house the second doped region in each finger.

16. The TVS device of claim 1, further comprising:
a sixth doped region of the first conductivity type formed in the current conducting region between the first finger and the second finger, the sixth doped region having a first portion overlapping the well region of the first finger and a second portion overlapping the well region of the second finger.

17. The TVS device of claim 16, further comprising:
a plurality of sixth doped region formed in the current conducting region between the first finger and the second finger.

18. The TVS device of claim 1, wherein the first doped region of the first finger comprises an extension portion and the well region of the first finger comprises an extension portion surrounding the extension portion of the first doped region, the extension portions extending into the current conducting region between the first finger and the second finger, the current conducting region between the first finger and the second finger having a first spacing outside of the extension portions, and the current conducting region between the extension portions having a second spacing narrower than the first spacing.

19. The TVS device of claim 1, further comprising:
a polysilicon gate formed on a gate dielectric layer and encircling the first doped region of the first finger, the polysilicon gate being formed in the well region of the first finger; and a seventh doped region of the first conductivity type formed on an outer side of the polysilicon gate, the seventh doped region overlapping the well region of the first finger and extending through the current conducting region to overlap the well region of the second finger, wherein the polysilicon gate, the first doped region and the seventh doped region formed an MOS transistor.

20. The TVS device of claim 1, further comprising:

a polysilicon gate formed on a gate dielectric layer and adjacent the first doped region of the first finger, the polysilicon gate overlapping the well region of the first finger; and an eighth doped region of the first conductivity type formed on an outer side of the polysilicon gate in the current conducting region between the first finger and the adjacent second finger, wherein the polysilicon gate, the first doped region and the eighth doped region formed an MOS transistor.

21. The TVS device of claim 1, further comprising:

a ninth doped region of the first conductivity type formed in a current conducting region between the first finger and the adjacent second finger and overlapping the well region of the first finger; and a trench formed adjacent the ninth doped region and being arranged in the direct path between the first finger and the second finger, the trench being filled with a dielectric layer.

* * * * *